(12) United States Patent
Kitahara

(10) Patent No.: US 6,687,123 B2
(45) Date of Patent: Feb. 3, 2004

(54) ELECTRONIC SYSTEM HAVING ELECTRONIC APPARATUS WITH BUILT-IN HEAT GENERATING COMPONENT AND COOLING APPARATUS TO COOL THE ELECTRONIC APPARATUS

(75) Inventor: Chihei Kitahara, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 10/020,625

(22) Filed: Dec. 7, 2001

(65) Prior Publication Data

US 2002/0105783 A1 Aug. 8, 2002

(30) Foreign Application Priority Data

Feb. 6, 2001 (JP) .................................. 2001-029902

(51) Int. Cl.[7] ................................................. H05K 7/20
(52) U.S. Cl. ...................... 361/695; 165/80.3; 165/121; 361/686; 361/687; 454/184; 710/101
(58) Field of Search ................................ 165/80.3, 121, 165/185; 361/686–687, 694–697, 715; 454/184; 710/101–103, 304

(56) References Cited

U.S. PATENT DOCUMENTS

| 6,084,769 A | * | 7/2000 | Moore et al. ............... 361/687 |
| 6,094,347 A | | 7/2000 | Bhatia |
| 6,241,007 B1 | | 6/2001 | Kitahara et al. |
| 6,275,945 B1 | * | 8/2001 | Tsuji et al. .................. 710/101 |
| 6,276,448 B1 | * | 8/2001 | Maruno ........................ 361/687 |
| 6,343,010 B1 | * | 1/2002 | Tanaka ......................... 361/687 |
| 6,353,536 B1 | * | 3/2002 | Nakamura et al. .......... 361/687 |

FOREIGN PATENT DOCUMENTS

| JP | 10275034 | 10/1998 |
| JP | 207063 | 7/2000 |
| JP | 231424 | 8/2000 |

OTHER PUBLICATIONS

U.S. patent application Ser. No. 09/487,480, Nakamura, filed Jan. 19, 2000.

* cited by examiner

Primary Examiner—Gregory Thompson
(74) Attorney, Agent, or Firm—Pillsbury Winthrop LLP

(57) ABSTRACT

A cooling apparatus includes a cooling module having an electrically-driven cooling device. The cooling module is adapted to couple with a portable electronic apparatus having a heat generating component and a first connector to supply power. A second connector is provided to be electrically connected to the cooling device. The second connector is connected to the first connector when it is coupled with the portable electronic apparatus to supply the cooling device with the power received from the first connector.

4 Claims, 17 Drawing Sheets

ELECTRONIC SYSTEM HAVING ELECTRONIC APPARATUS WITH BUILT-IN HEAT GENERATING COMPONENT AND COOLING APPARATUS TO COOL THE ELECTRONIC APPARATUS

CROSS-REFERENCE TO RELATED APPLICATIONS

This application is based upon and claims the benefit of priority from Japanese Patent Application No. 2001-029902, filed Feb. 6, 2001.

BACKGROUND OF THE INVENTION

1. Field of the Invention

The present invention relates to an electronic system having an electronic apparatus such as portable computer, and a cooling apparatus to be used by coupling with the electronic apparatus.

2. Discussion of the Related Art

The power consumption of a portable electronic apparatus, such as a notebook computer, has been increasing due to higher processing speeds and multi-functionality of the microprocessor, and the microprocessor heat value tends to increase rapidly in proportion. Therefore, it is necessary to improve the heat radiation from the microprocessor in order to secure stable operation of portable computers.

As a countermeasure thereof, a conventional portable computer contains a heat sink thermally connected to the microprocessor, and there is an electric fan to provide cooling air to the heat sink, which cools down a hot microprocessor.

According to this conventional cooling method, as the cooling air supplied from the electric fan becomes a cooling medium for absorbing the heat from the microprocessor, the microprocessor cooling capacity depends largely on the blowing capacity of the electric fan. As a result, if the flow of cooling air is increased to enhance the microprocessor cooling capacity, the electric fan typically increases in size. Consequently, a large space would be required inside the housing of a portable computer for installing a bulky electric fan.

In general, for a portable computer, the housing is designed to be thin and compact because portability is a critical element for enhancing its product value. Therefore, a space for containing a large electric fan of a large blowing capacity or a draft air path for cooling air is too large be secured in the housing. As a result, there may be a concern that in the conventional cooling method, the microprocessor cooling capacity may be insufficient or may reach the thermal limit.

On the other hand, it is difficult to secure an installation section of connectors for connecting, for example, input/output devices and a space for containing a CD-ROM drive unit, due to the thinning of the housing, for portable computers. Therefore, recent portable computers are provided with an expansion connector and can obtain an expansion ability comparable to that of desktop computers, by connecting this expansion connector to an expansion apparatus called a docking station.

The conventional expansion apparatus typically includes a box-shape apparatus main body with built-in apparatuses for function expansion, such as a CD-ROM drive unit, a DVD drive unit, or the like. The apparatus main body has a top face on which the housing of the portable computer is placed, and a relay connector is arranged on this top face. The relay connector fits into the aforementioned expansion connector when the housing is put on the top face. A mutual fitting of these connectors allows an electric conduction of signal path for various control signals, such as mutual logical address, or a data path of the portable computer and the expansion apparatuses.

Among such kinds of expansion apparatuses, one for installing a heat sink in the apparatus main body and for cooling a heat sink with air blown by an electric fan is known. According to this expansion apparatus, when the housing of the portable computer is placed on the apparatus main body, this housing comes into contact with the heat sink. Consequently, heat conducted from the microprocessor to the housing is dissipated by heat conduction to the heat sink and borne by the flow of cooling air radiated outside the housing. Therefore, the portable computer may be cooled by using the expansion apparatus, thereby enhancing the cooling function of the portable computer.

However, an extremely thin and light notebook-type portable computer is designed to be mobile, and adapted to receive/transmit data from/to a client, or for use in a presentation at the premises of a client. Therefore, in the conventional configuration for supporting the microprocessor cooling by means of an expansion apparatus, it is necessary to carry all of the times a heavy and bulky expansion apparatus together with the portable computer. Consequently, it becomes impossible to put the portable computer in a bag, or the like, and carry about it easily, thus sacrificing its inherent portability.

In the case of just carrying solely the portable computer, the microprocessor cooling capacity may be insufficient. Therefore, especially when the microprocessor is tasked to execute complicated calculations and processing, there is a fear that the temperature of the microprocessor may exceed the operational limits. If the temperature of the microprocessor becomes too high, the processing speed may become slower, or the operation may become impossible due to thermal overload. Consequently, it becomes impossible to completely utilize all of the performance features of the microprocessor.

BRIEF SUMMARY OF THE INVENTION

The present invention has been devised based on such a situation and provides an electronic system capable of obtaining a desired cooling performance without sacrificing the portability, and a cooling apparatus used for a portable electronic system, such as a notebook computer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

Now, an embodiment of the present invention will be described based on the drawings applied to a portable computer.

Figure 1:
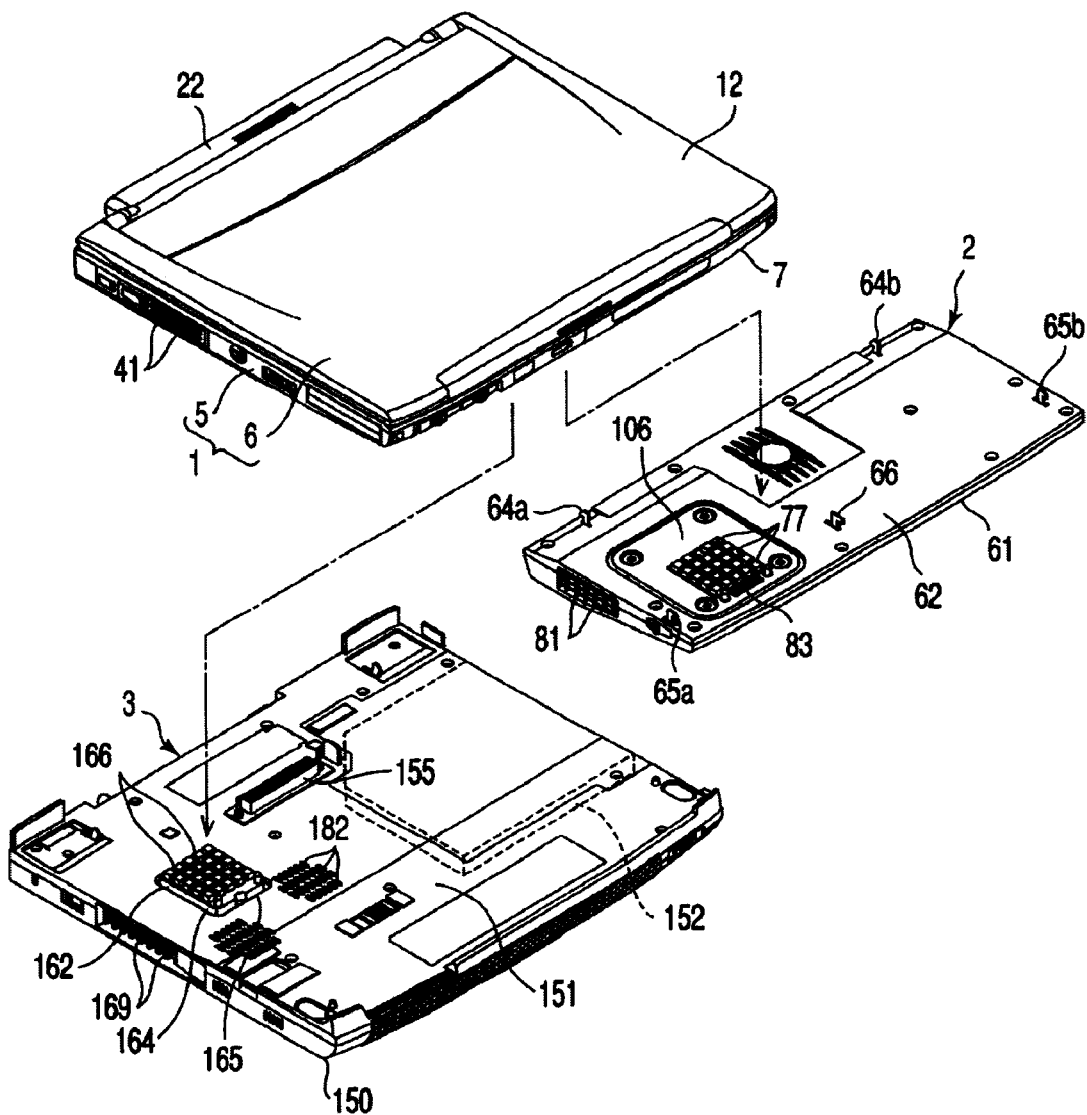
FIG. 1 is a perspective view of an electronic system having a portable computer, a cooling apparatus, and an expansion apparatus according to an embodiment of the present invention.

As shown in FIG. 1, an electronic system includes a portable computer 1 as an electronic apparatus, a cooling apparatus 2 for cooling of the portable computer 1, and an expansion apparatus 3 to be used for expanding the functionality of the portable computer 1.

Figure 2:
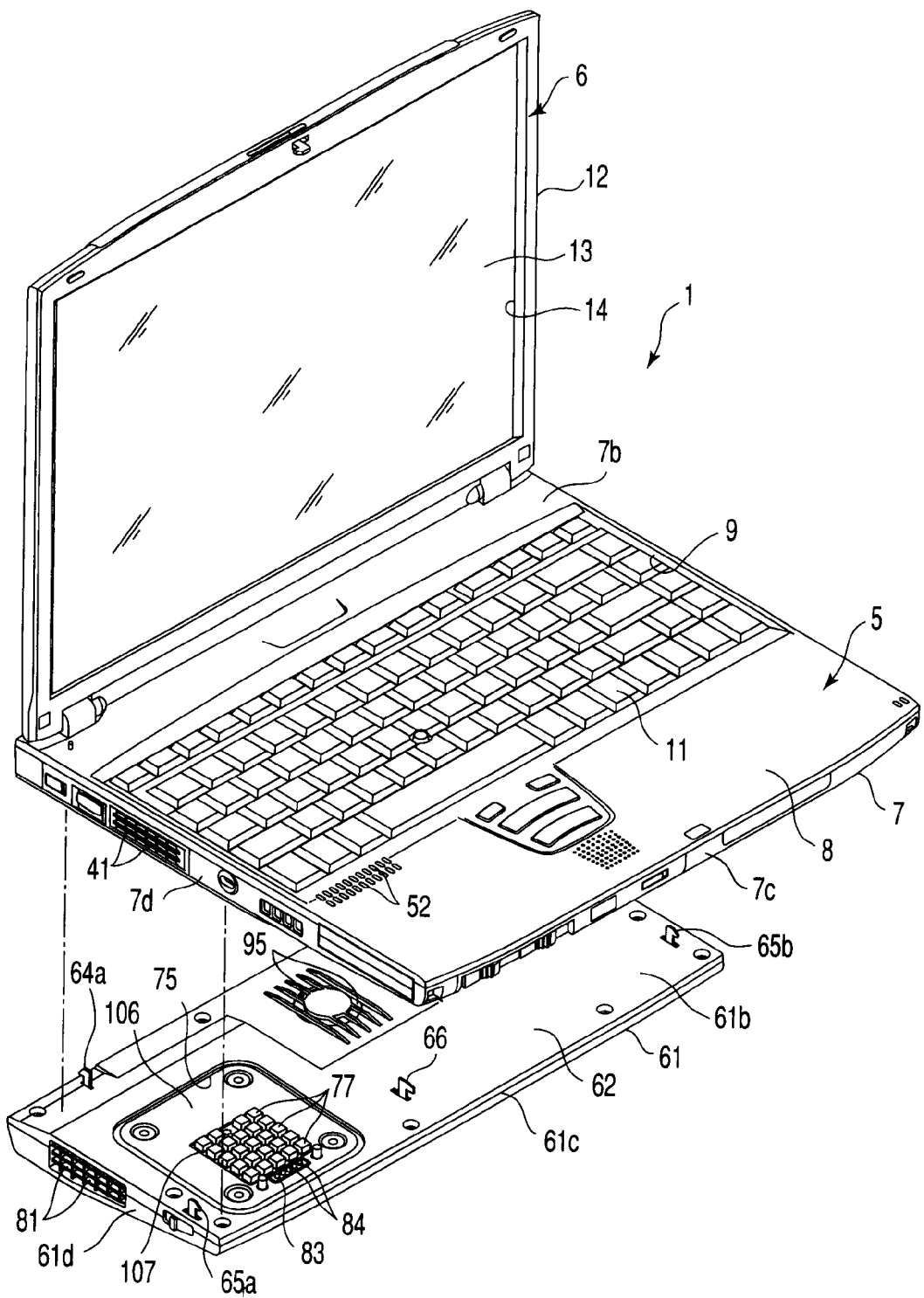
FIG. 2 is a perspective view of the electronic system showing a state where the portable computer and the cooling apparatus are separated.

As shown in FIG. 2, the portable computer 1 is constituted by a computer main body 5 and a display unit 6 supported by the computer main body 5. The computer main body 5 includes a housing 7. The housing 7 (shown in FIG. 1) is a flat box-shape having a bottom wall 7a, a top wall 7b, a front wall 7c, right and left side walls 7d, and a back wall 7e.

The top wall 7b of the housing 7 has a palm rest 8 and a keyboard attachment section 9. The palm rest 8 extends in the width direction of the housing 7 in a forward half section of the housing 7. The keyboard attachment section 9 is positioned behind the palm rest 8 and a keyboard 11 is installed on the keyboard attachment section 9.

The display unit 6 includes a display housing 12 and a liquid crystal panel 13 housed in the display housing 12. The liquid crystal panel 13 is exposed outward through an opening 14 at the front face of the display housing 12. The display housing 12 is linked with a rear end section of the housing 7 through a hinge device (not shown). Therefore, the display unit 6 can rotate from a closed position where it is pushed down so as to cover the palm rest 8 and the keyboard 11 from the top, to an open position where it is erected so as to expose the keyboard 11 and the liquid crystal panel 13.

Figure 3:
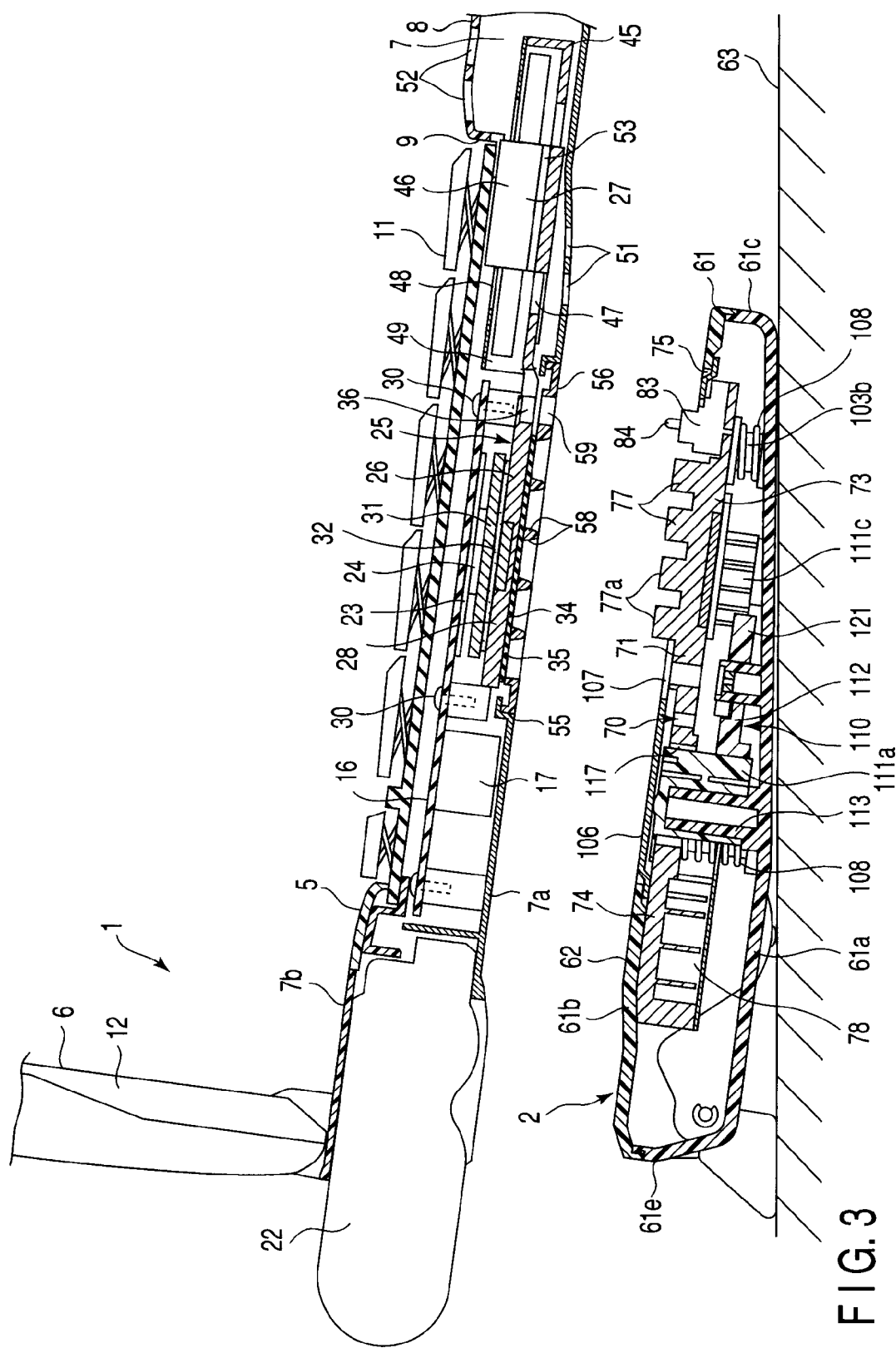
FIG. 3 is a cross-sectional view of the electronic system showing a state where the portable computer and the cooling apparatus are separated.

As shown in FIG. 3, the housing 7 contains a circuit board 16. The circuit board 16 has a lower surface facing to the bottom wall 7a, and a first expansion connector 17 is mounted on the rear end section of the lower surface of the circuit board 16. The first expansion connector 17 is opposed to a connector connection port 18 (shown in FIG. 4) opening on the bottom wall 7a. The connector connection port 18 is covered with a shutter 19 that can open and close.

Figure 4:
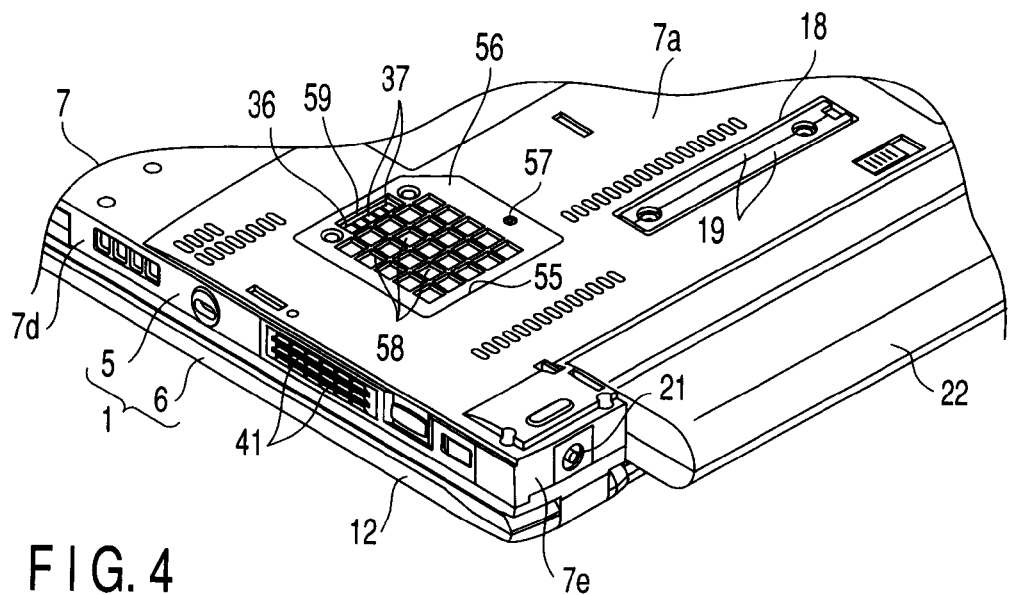
FIG. 4 is a perspective view of the portable computer showing a state where a cover is attached to a bottom wall of a housing.

As shown in FIG. 4, a power supply connector 21 is arranged at the right end section of the back wall 7e of the housing 7. The power supply connector 21 is for connecting a power supply cord (not shown). The power supply connector 21 is mounted on the circuit board 16, and is electrically connected to a power supply circuit on the circuit board 16.

A battery pack 22 serving as a power supply during carriage of the portable computer is supported detachably on the middle section of the back wall 7e of the housing 7. The battery pack 22 is electrically connected to the power supply circuit on the circuit board 16.

A semiconductor package 23 as a heat generating component is mounted on the lower face of the circuit board 16. The semiconductor package 23 may have a microprocessor at the center of the portable computer 1, and may have an IC chip 24 generating heat during the operation. When processing multimedia information such as character, sound, and images at high speeds, the IC chip 24 generates a large amount of heat. Therefore, the semiconductor package 23 requires cooling in order to maintain a safe operational temperature.

Figure 8:
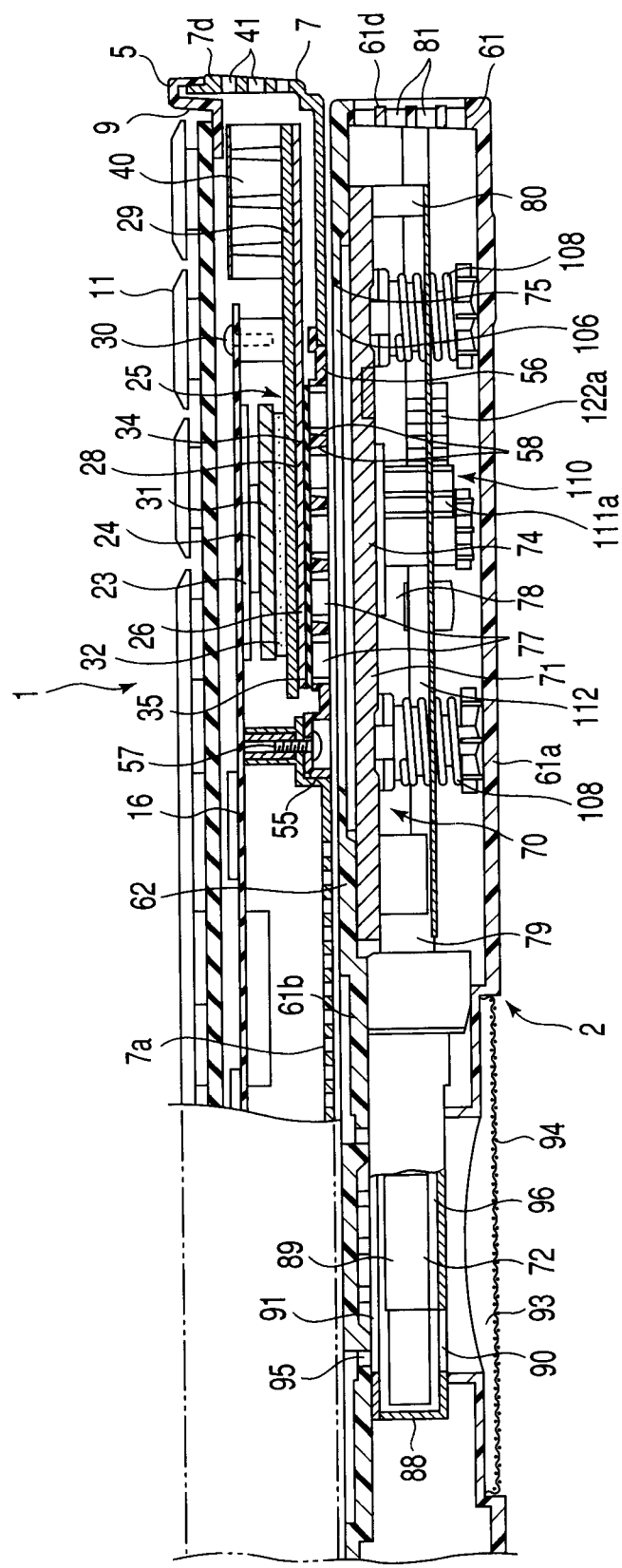
FIG. 8 is a cross-sectional view of the electronic apparatus system showing a positional relation between a first cooling module in the cooling apparatus and a cooling unit in the housing, in a state where the portable computer and the cooling apparatus are linked.

As shown in FIG. 3 and FIG. 8, the housing 7 has a built-in cooling unit 25 for cooling down the semiconductor package 23. The cooling unit 25 includes a first heat sink 26 and an electric fan 27. The first heat sink 26 is constituted by a metal material excellent in heat conductivity, such as aluminum alloy, for example. The first heat sink 26 includes a flat plate shape having a heat receiving portion 28 and a heat exchanging portion 29. The first heat sink 26 is arranged along the bottom wall 7a of the housing 7 and a plurality of points thereof are fixed to the bottom wall 7a and the circuit board 16 through screws 30.

The heat receiving portion 28 is opposed to the semiconductor package 23. The heat receiving portion 28 is thermally connected to the IC chip 24 of the semiconductor package 23 through a heat dissipation plate 31 and grease 32. The heat receiving portion 28 has a flat heat connection surface 34 at the side opposed to the semiconductor package 23. The heat connection surface 34 is adjacent to the bottom wall 7a of the housing 7, and is covered with a soft heat conductive sheet 35 as a heat connection section.

Figure 5:
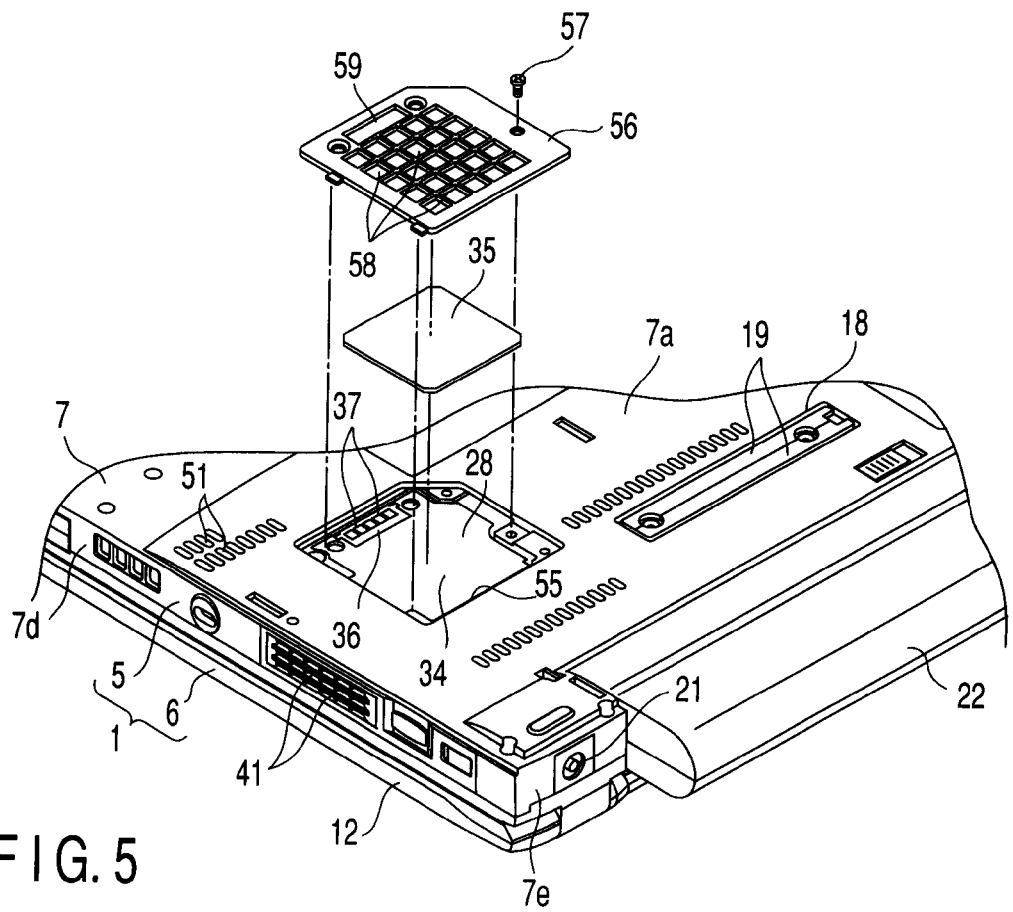
FIG. 5 is a perspective view of the portable computer showing a positional relation between a heat conductive sheet and a heat connection surface of a first heat sink in a state where the cover is detached from the bottom wall of the housing.

As shown in FIG. 5, the heat receiving portion 28 of the first heat sink 26 includes a first connector 36. The first connector 36 has a plurality of connection terminals 37 including power supply terminals, ground terminals, signal terminals for fan control, and signal terminals for recognizing the coupling of the cooling apparatus 2. These connection terminals 37 are arranged and aligned in a row at a position adjacent to the heat connection surface 34. The first connector 36 is electrically connected to the circuit board 16 through a cable 38 (shown in FIG. 12), and the power supply and various signals are supplied from this circuit board 16.

As shown in FIG. 8, the heat exchanging portion 29 is integrated with the heat receiving portion 28 and thermally connected to the heat receiving portion 28. The heat exchanging portion 29 has a cooling air passage 40. The cooling air passage 40 communicates with a cooling air exit 41 opening on the left side wall 7d of the housing 7.

As obvious from FIG. 3, the aforementioned electric fan 27 is positioned in front of the first heat sink 26. The electric fan 27 includes a fan casing 45 and a centrifuge impeller 46. The fan casing 45 is integrated with the first heat sink 26 and has a first suction port 47, a second suction port 48, and a discharge port 49. The first suction port 47 is opposed to a plurality of first air intake ports 51 opening at the bottom wall 7a of the housing 7. The second suction port 48 is partially opposed to a plurality of second air intake ports 52 opening on the palm rest 8. The discharge port 49 is opened toward the first heat sink 26 and the semiconductor package 23, and a part thereof is opposed to the upstream end of the cooling air passage 40.

The impeller 46 is supported on the fan casing 45 through a flat motor 53 and positioned between the aforementioned first suction port 47 and second suction port 48. The flat motor 53 is rotated based on a signal supplied from the circuit board 16 when the temperature of the semiconductor package 23 reaches a predetermined value.

When the impeller 46 is rotated by driving through the flat motor 53, air is pulled from the first and second suction ports 47, 48 toward the impeller 46. This air is discharged from the outer periphery of the impeller 46 and delivered to the cooling air passage 40 and the semiconductor package 23 through the discharge port 49.

As obvious from FIG. 3 to FIG. 5, the bottom wall 7a of the housing 7 has an opening 55. The opening 55 is positioned in the latter half section of the bottom wall 7a so as to correspond to the heat connection surface 34 of the first heat sink 26. The opening 55 has an opening shape larger than the heat connection surface 34. This opening 55 is covered with a cover 56. The cover 56 has a flat plate shape to fit correctly into the opening 55, and is fixed to the bottom wall 7a through a screw 57.

The cover 56 has a plurality of through holes 58 and a connector deliver port 59. The through holes 58 are arranged in a matrix, and the heat conductive sheet 35 is exposed outside the housing 7 through these through holes 58. The connector delivery port 59 is opposed to the first connector 36, and the connection terminals 37 of the first connector 36 is exposed outside the housing 7 through this connector delivery port 59.

Figure 6:
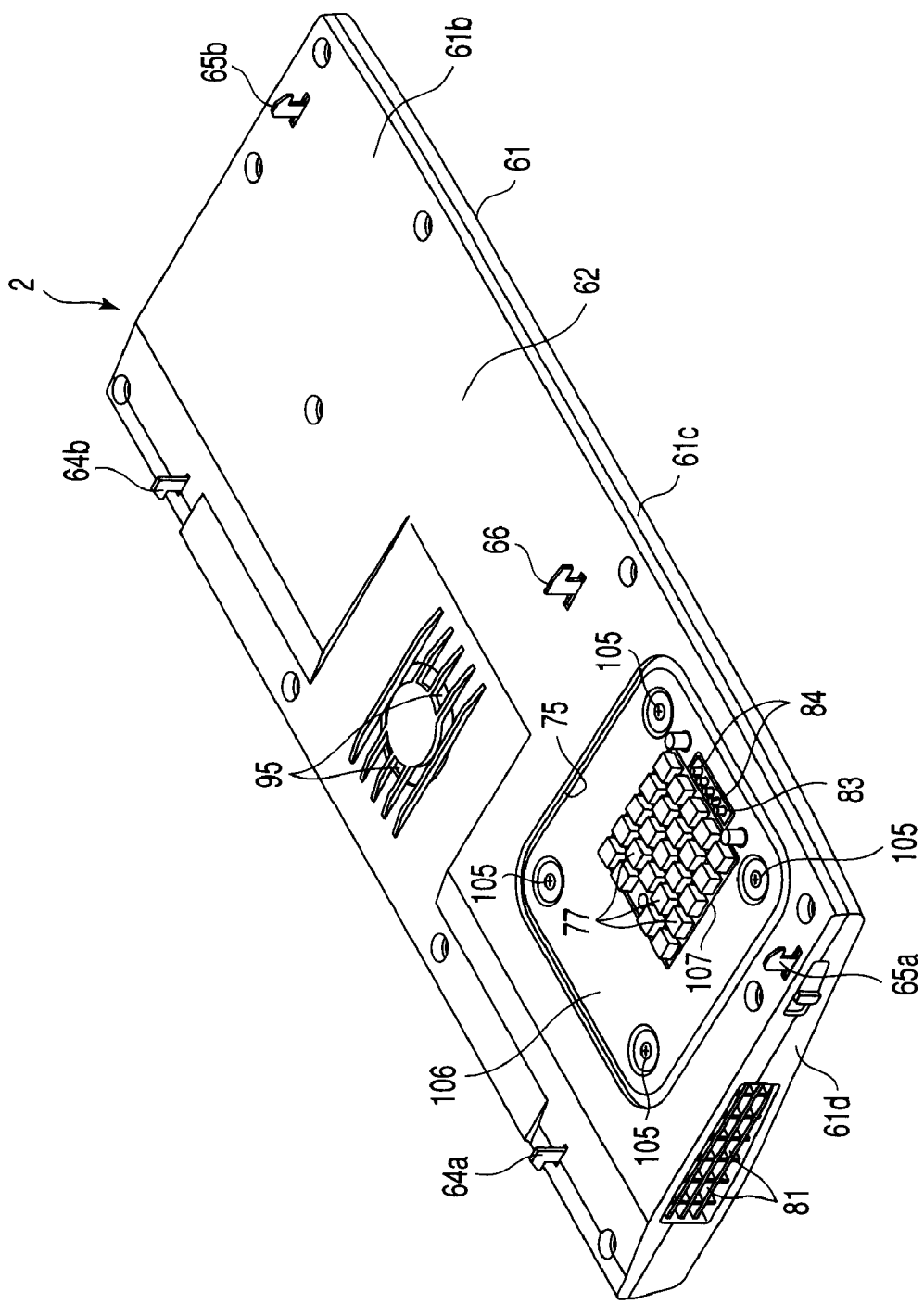
FIG. 6 is a perspective view of a cooling apparatus.

As shown in FIG. 2, FIG. 3 and FIG. 6, the cooling apparatus 2 for cooling the portable computer 1 includes a flat box-shape apparatus main body 61. The apparatus main body 61 has a bottom wall 61a, a top wall 61b, a front wall 61c, right and left side walls 61d and a back wall 61e and is defined to a size corresponding to the latter half section of the aforementioned housing 7. Therefore, the apparatus main body 61 is set to a size approximately half of the housing 7. The shape of its top wall 61b has a rectangular shape extending in the width direction of the housing 7.

Figure 7:
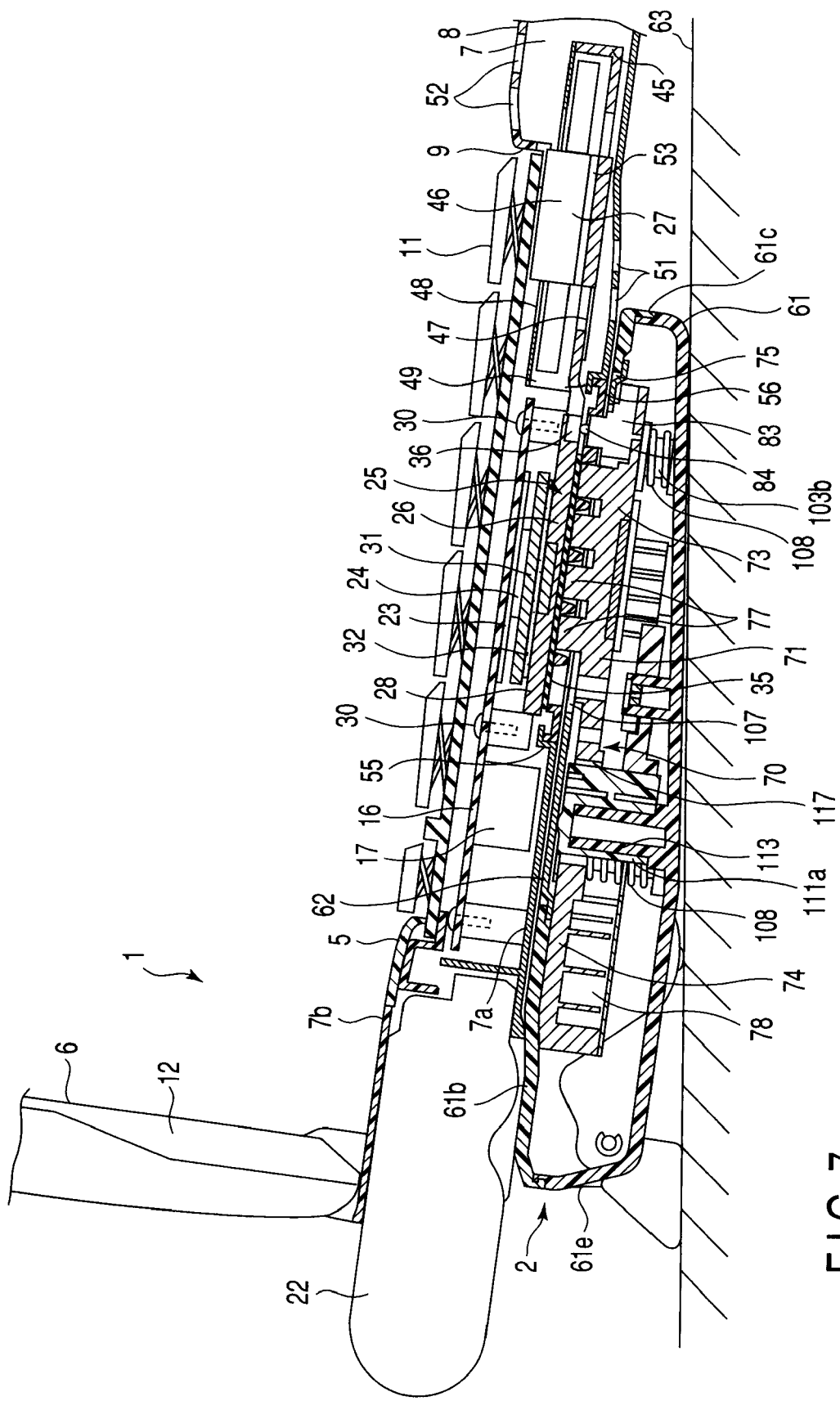
FIG. 7 is a cross-sectional view of the electronic system showing a state where the portable computer and the cooling apparatus are linked.

The apparatus main body 61 has a flat rest section 62. The rest section 62 is the one where the latter half section of the housing 7 rests detachably, and is constituted by the top wall 61b of the apparatus main body 61. The rest section 62 is inclined downward gradually from the rear end to the front end thereof, when the apparatus main body 61 is put on a horizontal installation surface 63 such as desk top, for example. As a result, when the housing 7 of the portable computer 1 is put on the rest section 62, as shown in FIG. 7, the portable computer 1 is inclined to a posture where the side of the palm rest 8 and the keyboard 11 becomes low, thereby improving the manipulability during the input operation.

A pair of fixing hooks 64a, 64b are arranged at the rear end of the rest section 62. The fixing hooks 64a, 64b are separated from each other in the width direction of the rest section 62, and the rear end section of the bottom wall 7a of the housing 7 is detachably hooked to these fixing hooks 64a, 64b.

A pair of movable hooks 65a, 65b are arranged at the front end of the rest section 62. The movable hooks 65a, 65b are arranged separately from each other in the width direction of the rest section 62. These movable hooks 65a, 65b are supported slidably forward and backward from a lock position to be hooked respectively to the bottom wall 7a of the housing 7, and an unlock position disengaging from the bottom wall 7a.

A cooperation hook 66 is arranged in a middle section along the width direction of the rest section 62. The cooperation hook 66 has an arm section 67 (shown in FIG. 10 or FIG. 11) along the bottom wall 61a of the apparatus main body 61. The arm section 67 is supported rotatably by the bottom wall 61a of the apparatus main body 61 at the end section opposite to the cooperation hook 66. Therefore, the cooperation hook 66 is rotatable forward and backward from a lock position (shown in FIG. 11) to be hooked to the bottom wall 7a of the housing 7, and an unlock position (shown in FIG. 10) disengaging from this bottom wall 7a.

Figure 9:
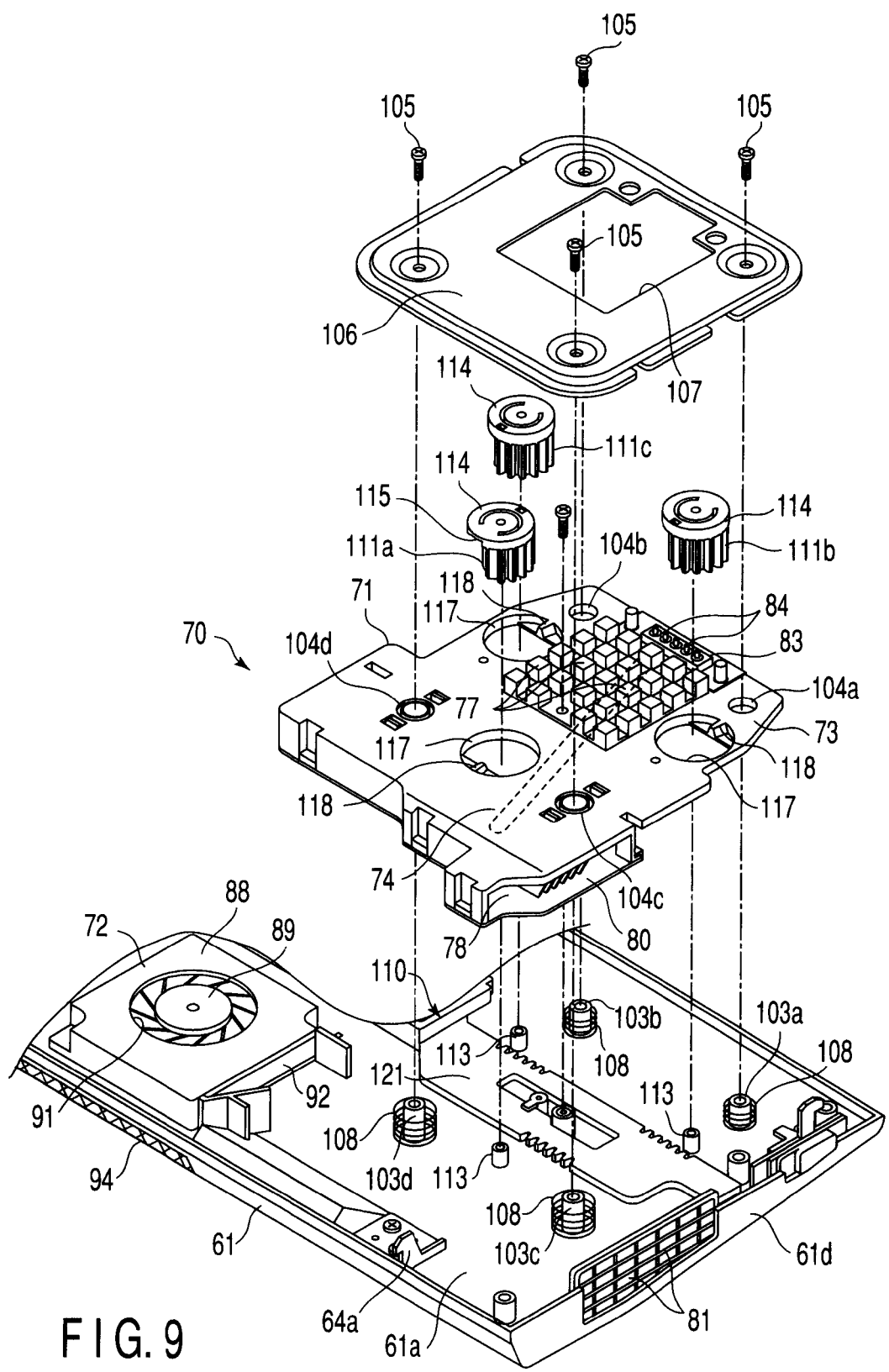
FIG. 9 is a perspective view of the cooling apparatus showing a positional relation between a second heat sink and an operation mechanism.

As shown in FIG. 3, FIG. 8 and FIG. 9, the apparatus main body 61 has a built-in first cooling module 70. The first cooling module 70 is configured to cool the semiconductor package 23 in cooperation with the cooling unit 25 of the portable computer 1. The first cooling module 70 includes a second heat sink 71 and an electric fan 72 as a cooling device to be driven electrically.

The second heat sink 71 is constituted by a metal material excellent in heat conductivity, such as aluminum alloy, for example. This second heat sink 71 has a flat plate shape having a heat receiving portion 73 and a heat exchanging portion 74. The second heat sink 71 is arranged in parallel to the rest section 62 of the apparatus main body 61 at a position shifted to the left from the middle section along the width direction of the apparatus main body 61.

The heat receiving portion 73 and the heat exchanging portion 74 are arranged in the longitudinal direction of the apparatus main body 61, and positioned on the same plane to each other. The heat receiving portion 73 faces a square opening 75 opened in the top wall 61b of the apparatus main body 61. As a result, the heat receiving portion 73 is positioned under the heat connection surface 34 of the aforementioned first heat sink 26, when the housing 7 is put on the rest section 62.

A plurality of heat receiving convex sections 77 are formed integrally on the top face of the heat receiving portion 73. The heat receiving convex section 77 has a prism shape that may be inserted into the through hole 58 of the cover 56 respectively. These heat receiving convex sections 77 are ejected vertically from the top face of the heat receiving portion 73 and arranged in a matrix. The tip of the heat receiving convex section 77 includes a flat contact surface 77a. These flat contact surfaces 77a are positioned on the same plane.

The heat exchanging portion 74 is positioned behind the heat receiving portion 73. A cooling air passage 78 is formed at the rear end section of the heat exchanging portion 74. The cooling air passage 78 extends in the width direction of the apparatus main body 61, and has a cooling air intake port 79 and a cooling air discharge port 80, as shown in FIG. 8. The cooling air intake port 79 is opened inside the apparatus main body 61. The cooling air discharge port 80 is positioned at the side opposite to the cooling air intake port 79, and faces a cooling air outlet 81 opened on the left side wall 61 of the apparatus main body 61.

As shown in FIG. 3 and FIG. 9, the heat receiving portion 73 of the second heat sink 71 is provided with a second connector 83. The second connector 83 has a plurality of pin shaped connection terminals 84 including power supply terminals, ground terminals, signal terminals for fan control, and signal terminals for recognizing the coupling of the cooling apparatus 2. These connection terminals 84 are arranged and aligned in a row at the front end section of the heat receiving portion 73. These connection terminals 84 are constituted so as to face the connection terminals 37 of the first connector 36, when the housing 7 is put on the aforementioned rest section 62.

Figure 10:
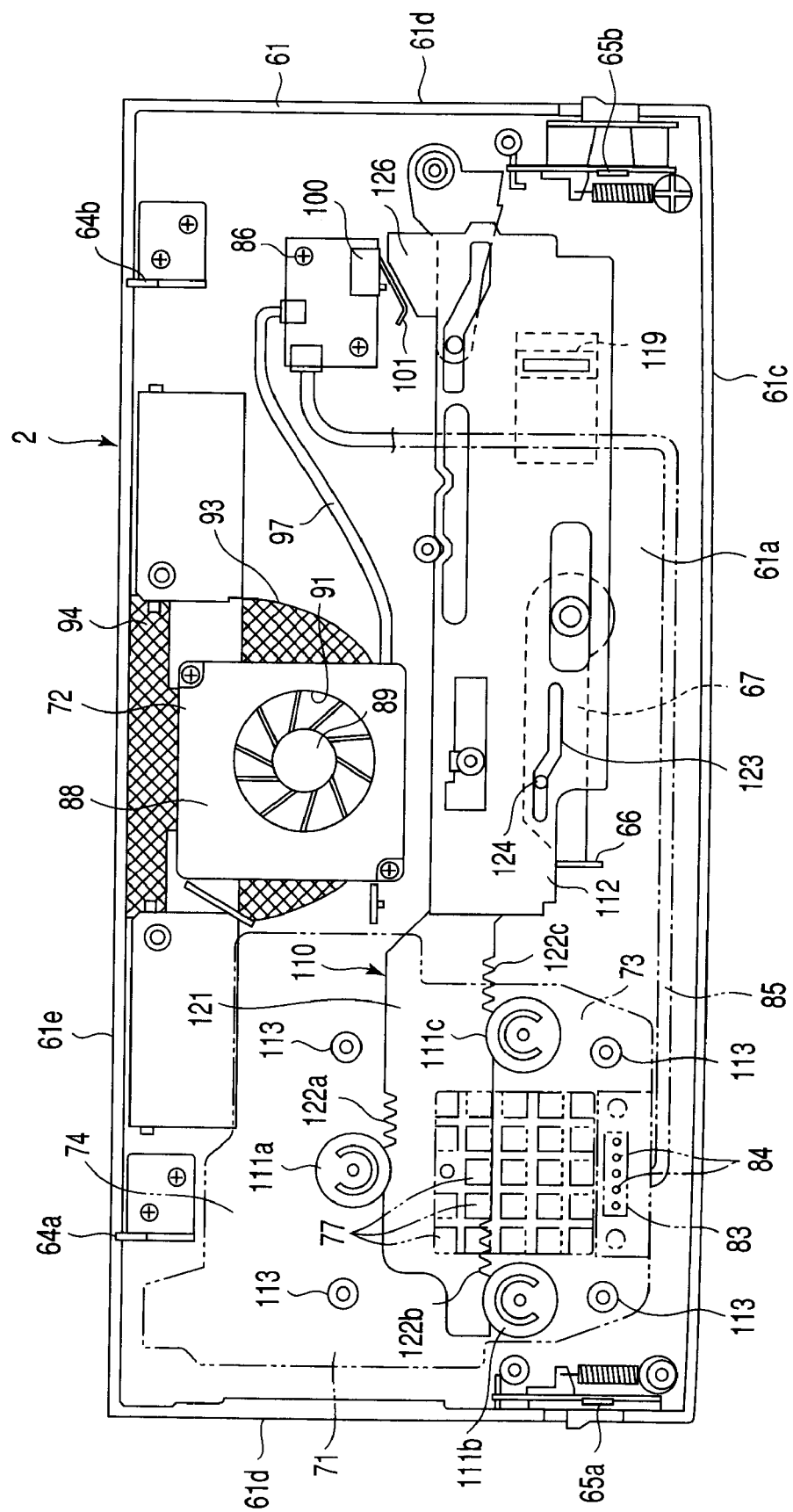
FIG. 10 is a plan view of the cooling apparatus showing a positional relation between a slider slid to a second position, a first cooling module, and a switch operation lever.

As shown in FIG. 10, a cable 85 connected to the second connector 83 is electrically connected to a relay substrate 86. The relay substrate 86 is fixed is to the right end section of the bottom wall 61a of the apparatus main body 61.

As obvious from FIG. 8 to FIG. 10, the aforementioned electric fan 72 is independent from the second heat sink 71, and is positioned at the middle section along the width direction of the apparatus main body 61. The electric fan 72 includes a fan casing 88 and a centrifuge type impeller 89 housed in this fan casing 88.

The fan casing 88 is fixed to the bottom wall 61a of the apparatus main body 61, at the right of the second heat sink 71. This fan casing 88 has a first suction port 90, a second suction port 91, and a discharge port 92.

The first suction port 90 faces a first draft hole 93 opened on the bottom wall 61a of the apparatus main body 61. The first draft hole 93 has an opening shape larger than the fan casing 88 and is covered with a net shaped fan cover 94. The second suction port 91 faces a plurality of second draft holes 95 opened on the rest section 62. The second draft holes 95 are configured to face the bottom wall 7a of the housing 7, when the housing 7 of the portable computer 1 rests on the rest section 62. The discharge port 92 is opened toward the cooling air intake port 79 of the cooling air passage 78.

The impeller 89 is supported on the fan casing 88 through a flat motor 96 and positioned between the first and second intake ports 90, 91. The flat motor 96 has a cable 97 (shown in FIG. 10 and FIG. 11) pulled outward the fan casing 88. This cable 97 is connected to the relay substrate 86.

A switch 100 is mounted on the relay substrate 86. The switch 100 has an operation lever 101 for opening/closing a circuit for electrically connecting the cables 85, 97. When the circuit on the relay substrate 86 is closed through this operation lever 101, the second connector 83 and the flat motor 96 become electrically conductive. Therefore, the flat motor 96 is supplied with power supply voltage and various signals from the second connector 83.

As shown in FIG. 9, the bottom wall 61a of the apparatus main body 61 has four boss sections 103a to 103d protruding upward. The boss sections 103a to 103d are slidably inserted into four guide holes 104a to 104d opened in the second heat sink 71. Consequently, the second heat sink 71 is held vertically movable on the bottom wall 61a of the apparatus main body 61 taking the boss sections 103a to 103d as guide.

A cover plate 106 is affixed at the top end of the boss sections 103a to 103d through a plurality of screws 105. The cover plate 106 covers a part of the heat receiving portion 73 and heat exchanging portion 74 from the top, and is exposed to the rest section 62 through the aforementioned opening 75. The cover plate 106 has an opening 107 avoiding the aforementioned heat receiving convex sections 77 and the second connector 83. Consequently, the second heat sink 71 is interposed between the bottom wall 61a of the apparatus main body 61 and the cover plate 106, and pushed up toward the cover plate 106 by compression coil springs 108.

As shown in FIG. 3, in a state where the second heat sink 71 is pushed up by the compression coil springs 108, the heat receiving convex sections 77 are ejected from the opening 107, and the contact surface 77a of these heat receiving convex sections 77 project over the rest section 62. When the heat receiving convex sections 77 are pushed down, the second heat sink 71 goes down in a way to approach the bottom wall 61a, and the compression coil springs 108 are compressed.

Thereby, the second heat sink 71 is vertically movably supported by the apparatus main body 61 from a thermal connection position wherein the contact surface 77a of the heat receiving convex sections 77 projects over the rest section 62 to a housing position where the contact surface 77a of the heat receiving convex sections 77 sinks to a position approximately flush with the top face of the rest section 62.

Figure 11:
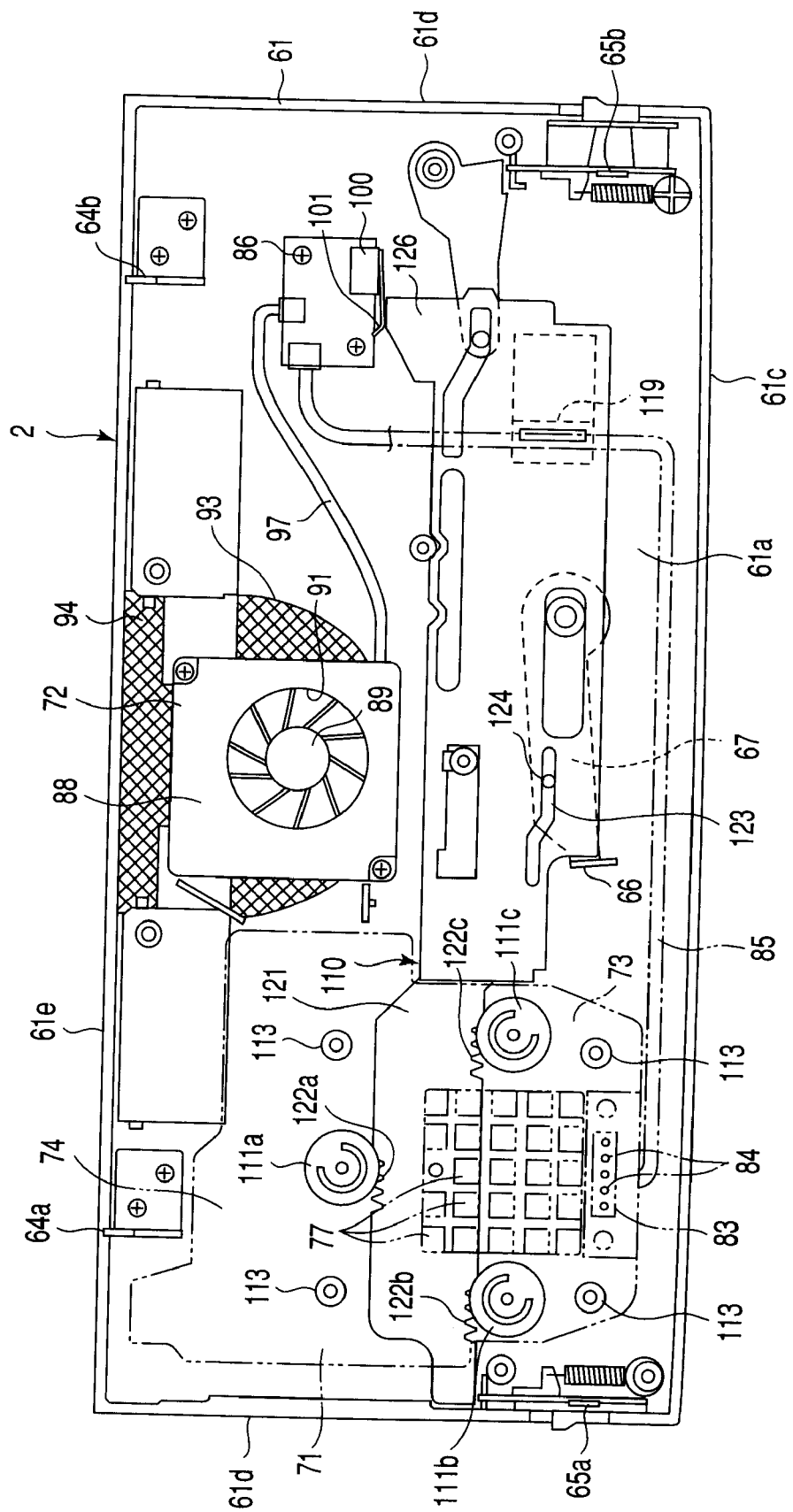
FIG. 11 is a plan view of the cooling apparatus showing a positional relation between a slider slid to a first position, the first cooling module, and the switch operation lever.

As shown in FIG. 9 to FIG. 11, the apparatus main body 61 has a built-in operation mechanism 110 for moving vertically the second heat sink 71 to the thermal connection position or housing position. The operation mechanism 110 has first to third cogs 111a to 111c and a slider 112 for rotating these first to third cogs 111a to 111c.

The first to third cogs 111a to 111c are supported rotatably in the axial direction on three boss sections 113 protruding from the bottom wall 61a. The first cog 111a is positioned at the heat exchange portion 74 of the second heat sink 71. The second cog 111b and the third cog 111c are positioned at the heat receiving portion 73 of the second heat sink 71. These cog 111b and 111c are separated in the width direction of the apparatus main body 61 across the heat receiving convex sections 77 therebetween. Moreover, the first to third cogs 111a to 111c have a flange section 114 at their top end respectively. An end cam 115 is formed at the bottom face of the flange section 114.

The second heat sink 71 has three circular insertion holes 117 at positions corresponding to the first to third cogs 111a to 111c. The insertion hole 117 has a diameter larger than the flange section 114 of the first to third cogs 111a to 111c. A cam receiving section 118 projecting radially inside is formed on the inner circumferential surface of the respective insertion holes 117. The cam receiving section 118 is slidably in contact with the end cam 115 of the flange section 114.

As shown in FIG. 10 and FIG. 11, the aforementioned slider 112 is supported by the bottom wall 61a slidably in the width direction of the apparatus main body 61. The slider 112 has a strip shape extending in the width direction of the apparatus main body 61 and a finger hook section 119 exposed to the bottom wall 61a of the apparatus main body 61 at the right end section thereof.

The slider 112 has a rack section 121 as shown in FIG. 9 at the left end section thereof. The rack section 121 penetrates under the second heat sink 71, and is introduced between the first to third cogs 111a to 111c. The rack section 121 has first to third rack teeth 122a to 122c. The first to third rack teeth 122a to 122c mesh with the first to third cogs 111a to 111c respectively. Consequently, when the slider 112 slides, the linear movement of this slider 112 is converted into rotation movement and conducted to the first to third cogs 111a to 111c, and these first to third cogs 111a to 111c are configured to cooperate and rotate around the axis over a predetermined angular range.

When the first to third cogs 111a to 111c rotate, the relative positional relation between the end cam 115 and the cam receiving section 118 of the second heat sink 71 varies. To be more specific, the end cam 115 is continuously inclined so as to project under the flange 114. Therefore, when the cam receiving section 118 comes into contact with the portion of minimum downward projection of the end cam 115, the second heat sink 71 is pushed up to the heat connection position under the energizing force of the compression coil springs 108. On the contrary, when the cam receiving section 118 comes into contact with the portion of maximum downward projection of the end cam 115, the second heat sink 71 receives a force for pressing toward the bottom wall 61a against the energizing force of the compression coil springs 108. Thereby, the second heat sink 71 goes down to the housing position.

Given this, the slider 112 is supported by the apparatus main body 61 linearly slidably from a first position for pushing up the second sink 71 to the heat connection position (shown in FIG. 11) and a second position for submerging the second heat sink 71 to the housing position (shown in FIG. 10).

The slider 112 traverses over the arm section 67 of the cooperation hook 66, and the slider 112 has a slit shape cam hole 123 at a position corresponding to the arm section 67. The arm section 67 has a pin shape guide projection 124 protruding upward. The guide projection 124 is slidably inserted into the cam hole 123. Therefore, the arm section 67 of the cooperation hook 66 is constituted so as to rotate forcibly based on the shape of the cam hole 123 when the slider 112 is slid. Thereby, the cooperation hook 66 moves to the lock position shown by FIG. 11 when the slider 112 is slid to the first position, and moves to the unlock position shown by FIG. 10 when this slider 112 is slid to the second position.

The right end section of the slider 112 is positioned just before the aforementioned relay substrate 86. A pressure section 126 is formed integrally with the right end section of this slider 112. The pressure section 126 presses the operation lever 101 of the aforementioned switch 100, when the slider 112 is slid to the first position shown in FIG. 11. This pressure closes the switch 100 and connects electrically the electric fan 72 and the second connector 83.

The pressure section 126 is disengaged from the operation lever 101 of the switch 100 when the slider 112 is slid to the second position shown in FIG. 10. Thereby, the operation lever 101 returns to the home position to open the switch 100, and interrupts the electrical connection between the electric fan 72 and the second connector 83.

Figure 13:
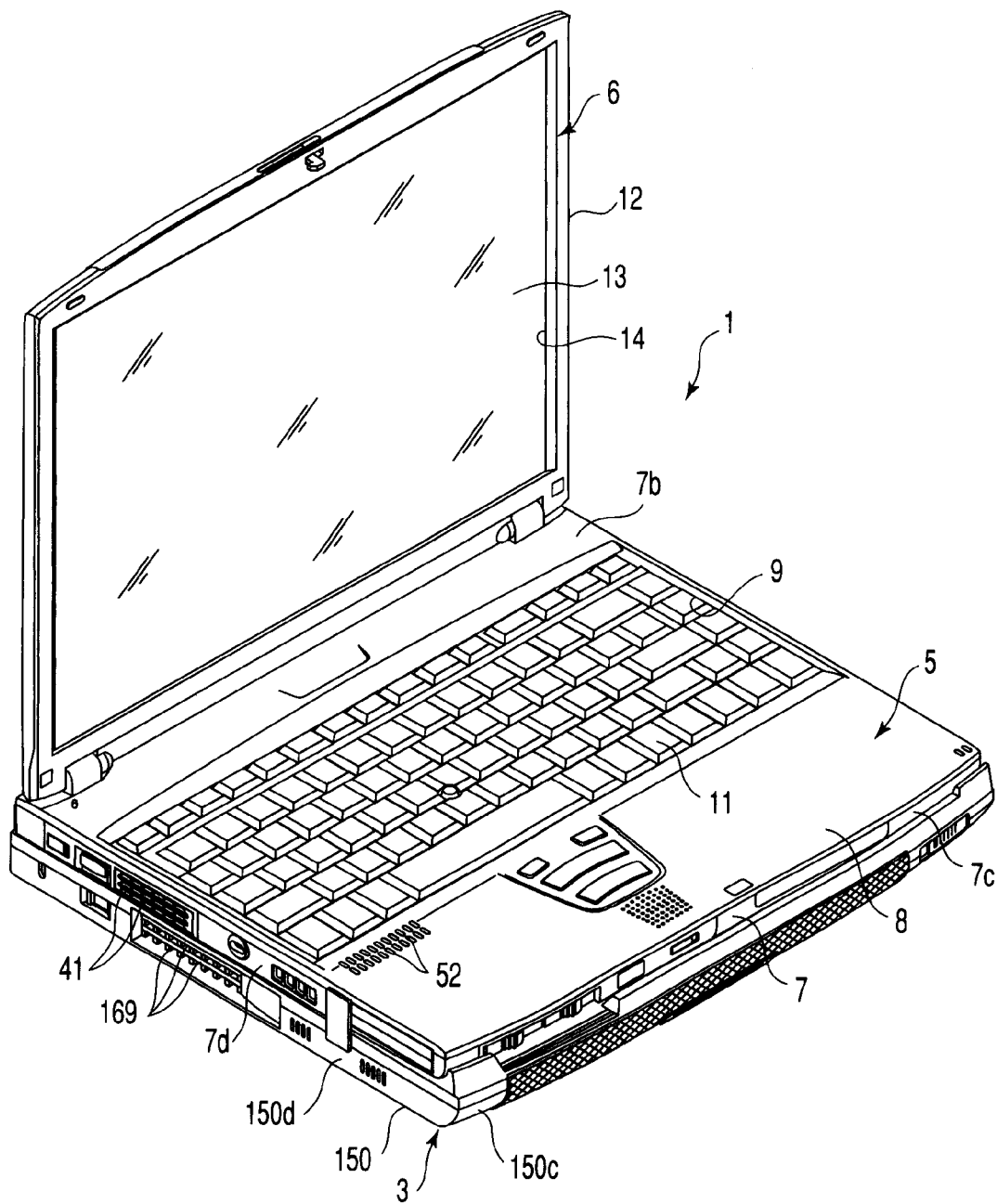
FIG. 13 is a perspective view of the electronic system showing a state where the portable computer and an expansion apparatus are linked.
Figure 14:
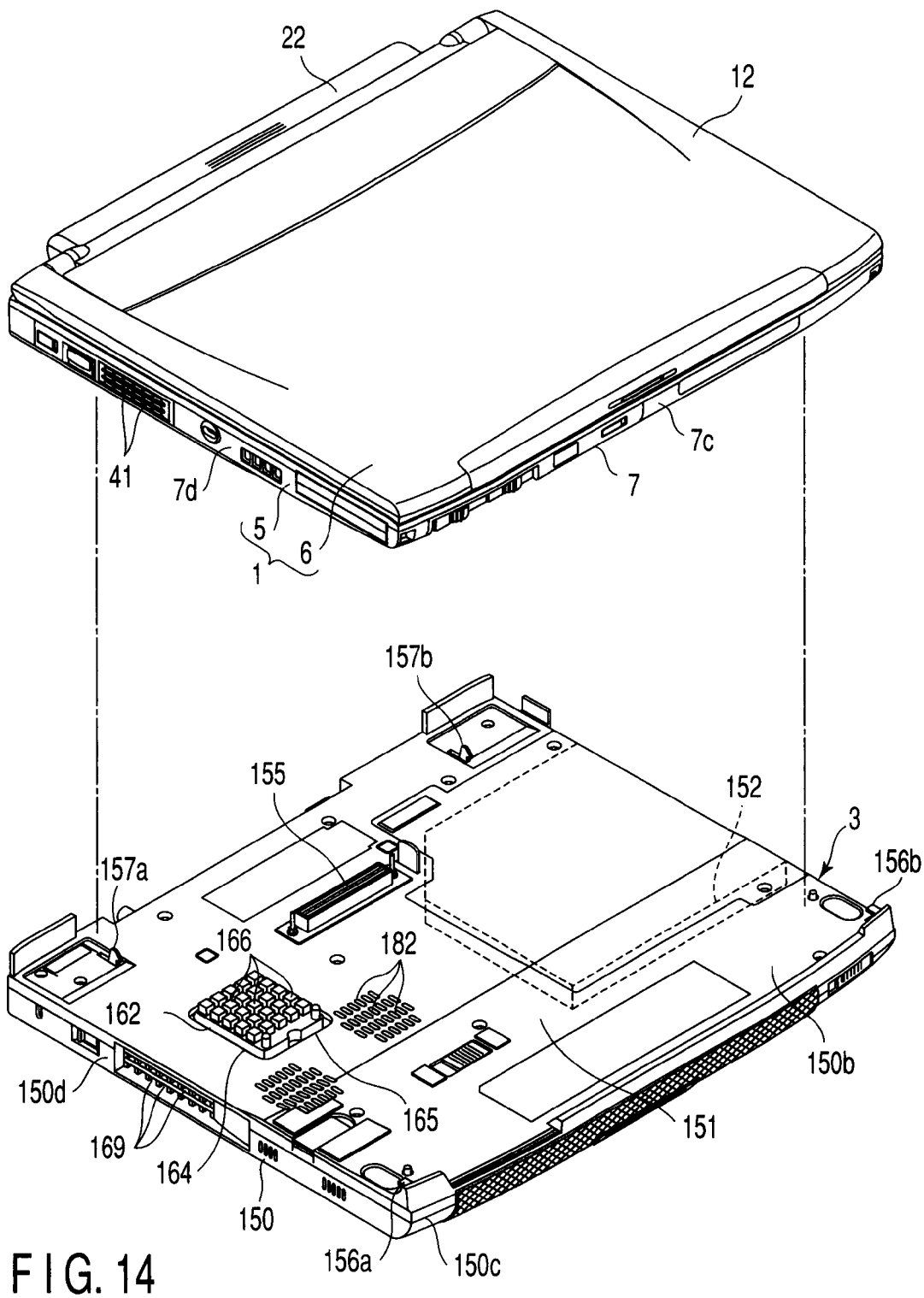
FIG. 14 is a perspective view of the electronic system showing a state where the portable computer and the expansion apparatus are separated.

The aforementioned expansion apparatus 3 for expanding the function of the portable computer 1 is detachably coupled with the portable computer 1 in exchange to the aforementioned cooling apparatus 2. This expansion apparatus 3 is provided with a flat box-shape base 150 as shown in FIG. 13 and FIG. 14. The base 150 has a bottom wall 150a, a top wall 150b, a front wall 150c, right and left side walls 150d, and a back wall 150e, and is defined to a size corresponding to the housing 7 of the portable computer 1. The base 150 is provided with a rest section 151 where the housing 7 is put detachably. The rest section 151 is constituted by the upper wall 150b of the base 150, and has a size approximately equal to the bottom wall 7a of the housing 7.

Figure 18:
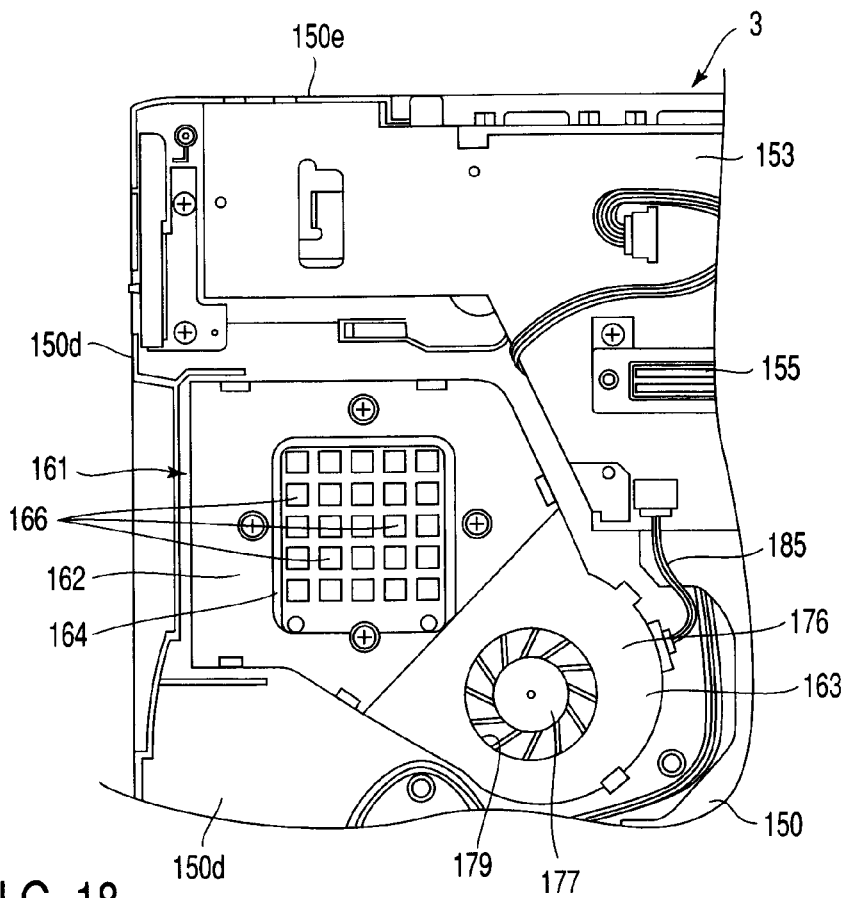
FIG. 18 a plan view of the second cooling module housed inside a base.

The base 150 has a DVD drive unit 152 and a circuit board 153 (shown in FIG. 18 and FIG. 19) inside. The DVD drive unit 152 is an element for expanding the function of the portable computer 1 and electrically connected to the circuit board 153. The circuit board 153 is arranged in parallel to the bottom wall 150a at the rear section of the base 150, and a second expansion connector 155 is mounted on the top face of the circuit board 150. The second expansion connector 155 projects on the rest section 151.

Figure 19:
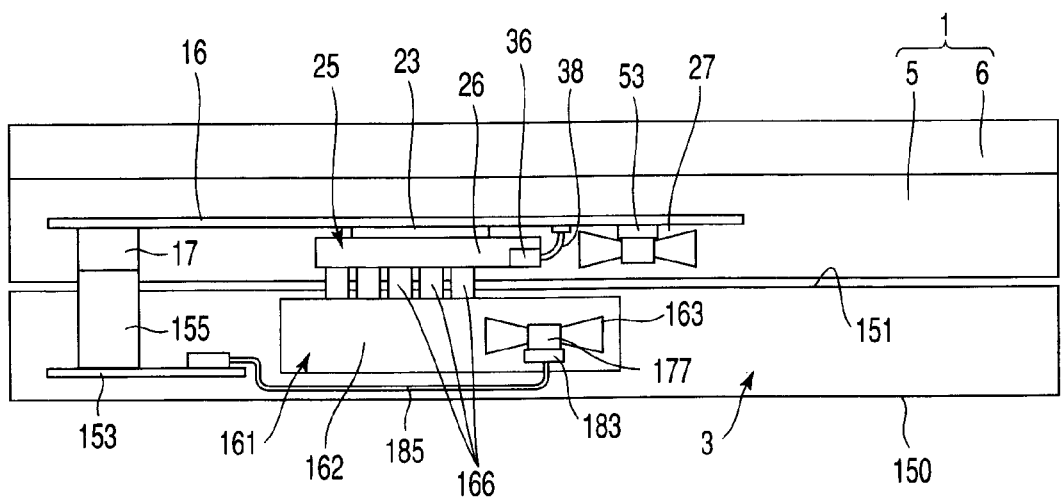
FIG. 19 is a side view of the electronic system schematically showing a state where the portable computer and the expansion apparatus are linked.

Therefore, if the housing 7 of the portable computer 1 is put on the rest section 151, as shown schematically in FIG. 19, the first expansion connector 17 and the second expansion connector 155 engage with each other. Thereby, the portable computer 1 and the expansion apparatus 3 are electrically connected through the first and second expansion connectors 17, 155, and the signal path of various control signals, such as logic address, or data bus of them both becomes electrically conductive.

Further, a power supply connector (not shown) is mounted on the rear end section of the circuit board 153. The power supply connector is configured to connect a power supply cord and is exposed on the rear wall 150e of the base 150. The power supply connector is electrically connected to the power supply circuit on the circuit substrate 153.

As shown in FIG. 14, a pair of guide protrusions 156a, 156b to be engaged detachably with the front wall 7c of the housing 7 are arranged at the front end of the rest section 151. Further, a pair of lock levers 157a, 157b are arranged at the rear end of the rest section 151. The lock levers 157a, 157b are constituted so as to lock the portable computer 1 on the rest section 151. The lock levers 157a, 157b are supported on the base 150 movably between a lock position to engage with the bottom wall 7a of the housing 7 of the portable computer 1, and an unlock position to separate from the bottom wall 7a.

Figure 15:
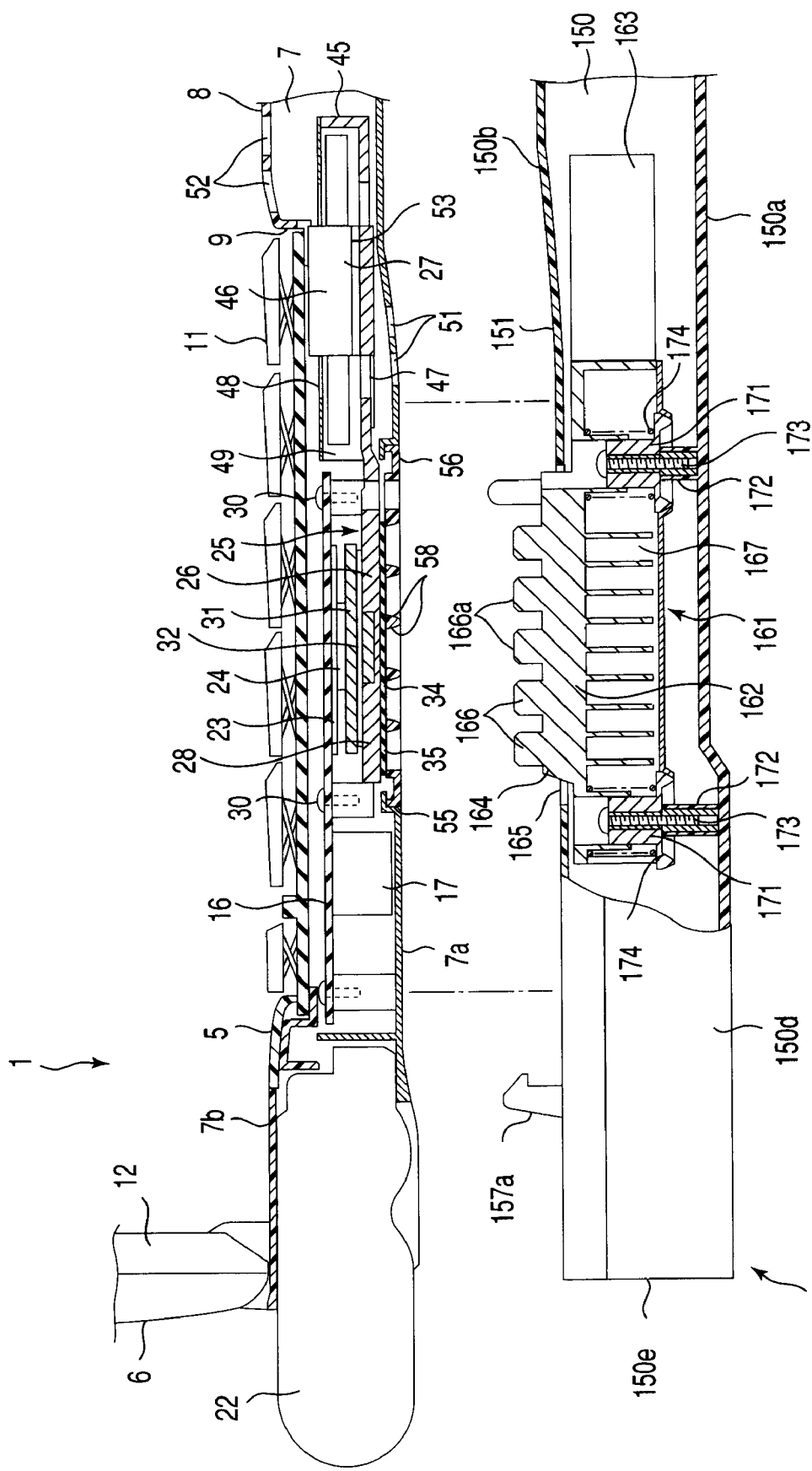
FIG. 15 is a cross-sectional view of the electronic system showing a state where the portable computer and the expansion apparatus are separated.
Figure 16:
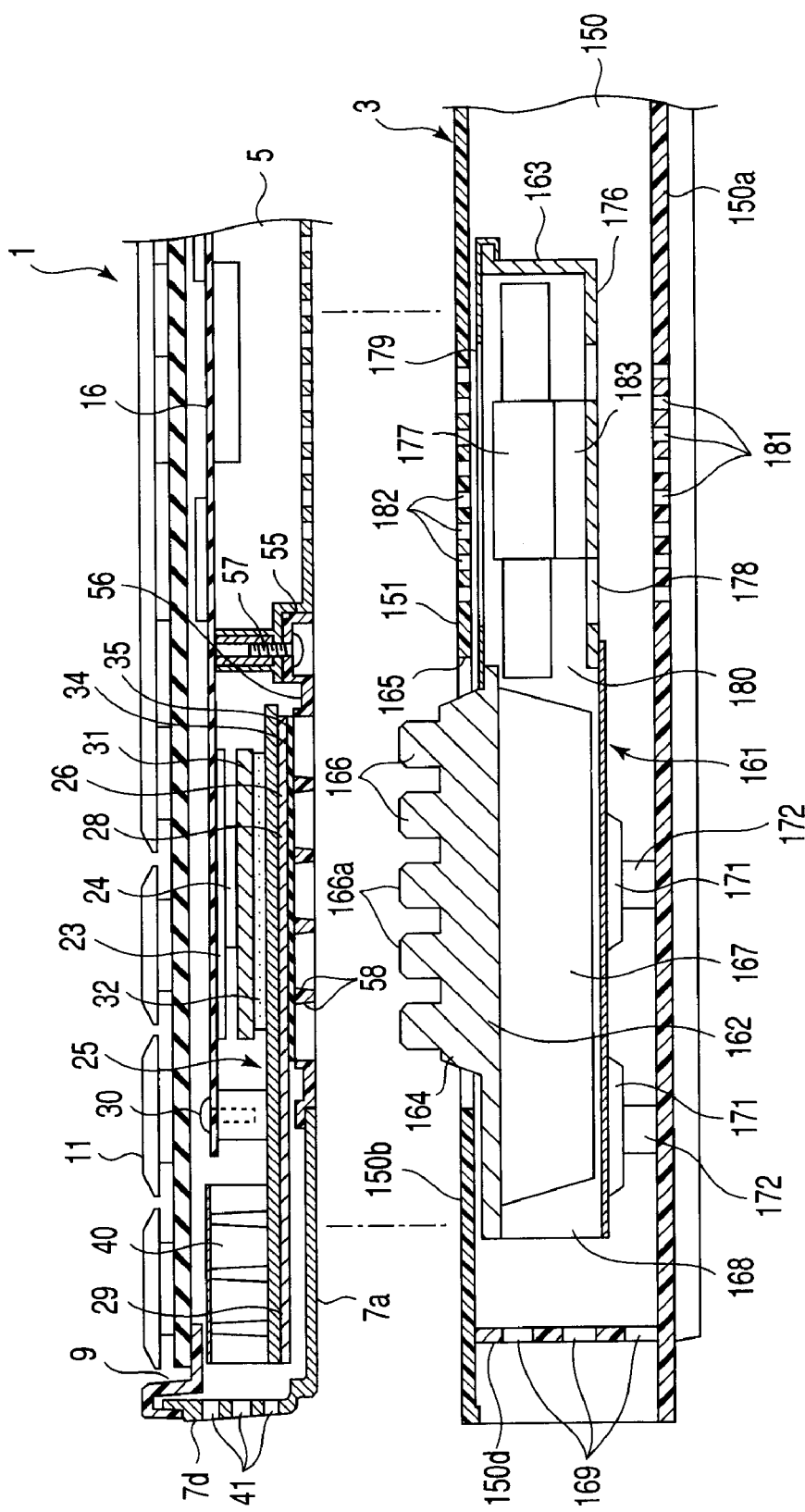
FIG. 16 is a cross-sectional view of the electronic system showing a positional relation between the cooling unit of the portable computer and the second cooling module of the expansion apparatus.
Figure 17:
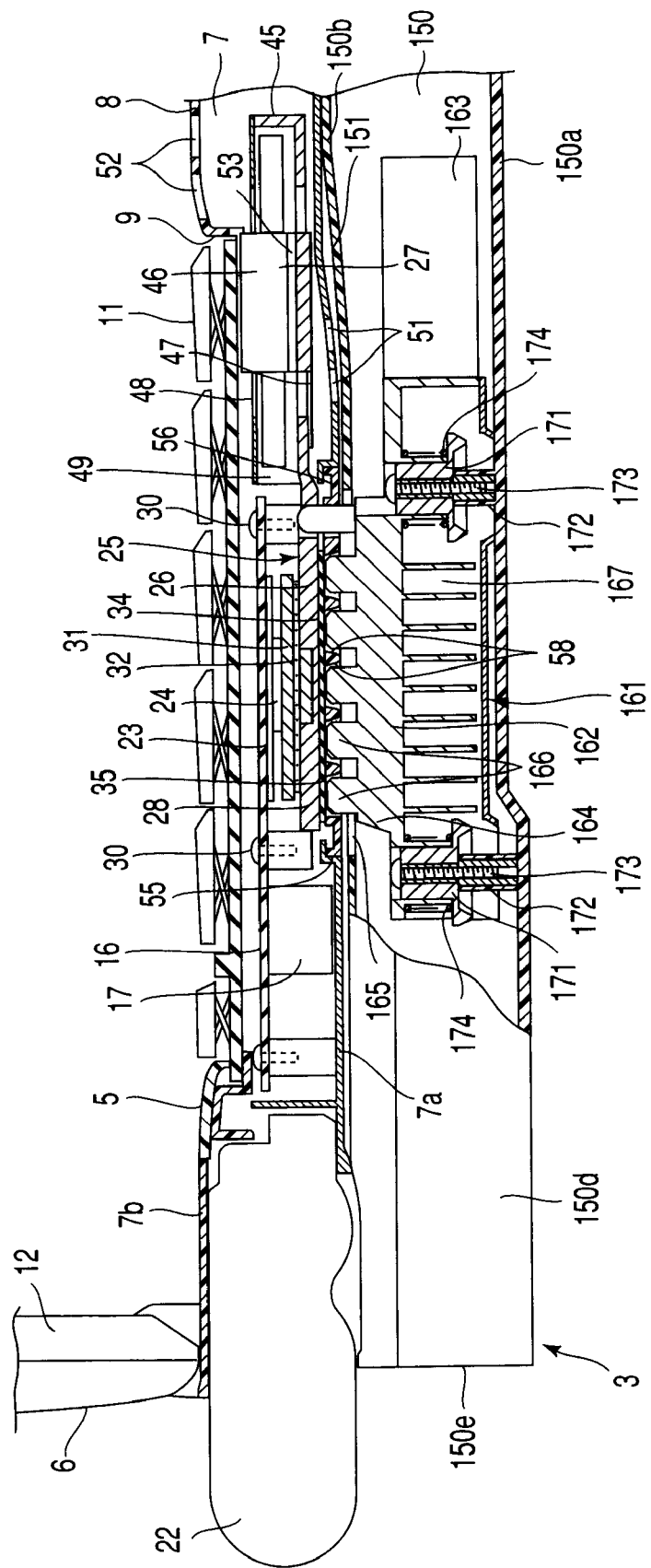
FIG. 17 is a cross-sectional view of the electronic system showing a state where the portable computer and the expansion apparatus are linked.

As shown in FIG. 15 to FIG. 17, the base 150 has a built-in second cooling module 161. The second cooling module 161 is constituted so as to support the cooling of the portable computer 1 and includes a third heat sink 162 and an electric fan 163.

The third heat sink 162 is constituted by a metal material excellent in heat conductivity, such as aluminum alloy, for example, and has a flat plate shape. The third heat sink 162 is arranged in parallel to the bottom wall 150a of the base 150, and a pedestal section 164 projecting upward is formed integrally with the top face thereof. The pedestal section 164 is exposed on the rest section 151 through an opening 165 opened at the top wall 150b. Consequently, the pedestal section 164 is positioned under the heat connection surface 34 of the aforementioned first heat sink 26, when the housing 7 of the portable computer 1 is put on the rest section 151.

The pedestal section 164 has integrally a plurality of heat receiving convex sections 166. The heat receiving convex sections 166 form respectively a prism that may be inserted into the through hole 58 of the aforementioned cover 56. The heat receiving convex sections 166 are arranged in a matrix, and project vertically from the top face of the pedestal 164. The tip of each heat receiving convex section 166 includes a flat contact surface 166a. These contact surfaces 166a are positioned on a same plane.

As shown in FIG. 15 and FIG. 16, the third heat sink 162 has a cooling air passage 167. The cooling air passage 167 is positioned under the heat receiving convex sections 166. The cooling air passage 167 has a cooling air outlet 168 opened toward the left side wall 150d of the base 150. The cooling air outlet 168 communicates with an exhaust port 169 opened on the side wall 150d.

A plurality of slide guides 171 are supported vertically slidable by the third heat sink 162. The slide guides 171 are positioned around the aforementioned pedestal 164. These slide guides 171 are fixed to a plurality of boss sections 172 projecting upward from the bottom wall 150a through screws 173. A plurality of compression coil springs 174 are interposed between the lower end of the slide guides 171 and the bottom face of the third heat sink 162. The compression coil springs 174 push up the third heat sink 162 towards the rest section 151.

Consequently, when the third heat sink 162 is pressed downward, the compression coil springs 174 are compressed, and the third heat sink 162 goes down in a way to approach the bottom wall 150a of the base 150 along the slide guides 171. Thereby, the third heat sink 162 is vertically movable from a thermal connection position wherein the heat receiving convex sections 166 projects over the rest section 151 to a housing position where the pedestal section 164 goes down inside the base 150, and is always held at the thermal connection position.

As shown in FIG. 16, the aforementioned electric fan 163 is positioned at the side opposed to the aforementioned cooling air outlet 168 across the cooling air passage 167. The electric fan 163 includes a fan casing 176 and a centrifuge-type impeller 177. The fan casing 176 is integrated with the third heat sink 162. The fan casing 176 has a first suction port 178, a second suction port 179, and a discharge port 180. The first suction port 178 faces a plurality of first air inlet ports 181 opened at the bottom wall 150a. The second suction port 179 faces a plurality of second air inlet ports 182 opened on the top wall 150b. The discharge port 180 communicates with the upstream end of the cooling air passage 167.

The impeller 177 is supported on the fan casing 176 through a flat motor 183. The flat motor 183 has a cable 185 (shown in FIG. 18 and FIG. 19) pulled outside the fan casing 176. The cable 185 includes a signal line for supplying power supply voltage, and a signal line for carrying a signal for controlling the rotation of the impeller 177. The cable 185 is electrically connected to the aforementioned circuit board 153.

The flat motor 183 is rotated when the temperature of the semiconductor package 23 reaches a predetermined value. When the impeller 177 is rotated by driving the flat motor 183, air is pulled from the first and second suction inlets 178, 179 toward the impeller 177. The air is discharged from the outer circumferential section of the impeller 177, and delivered to the cooling air passage 167 through the discharge port 180.

Now, the procedures to use by coupling the portable computer 1 with the cooling apparatus 2 will be explained.

First, the slider 112 (see FIG. 10 and FIG. 11) of the cooling apparatus 2 is slid to the second position. So long as this slider 112 is in the second position, the second heat sink 71 goes down to the housing position and the cooperation hook 66 is held in the unlock position.

In this state, the fixing hooks 64a, 64b positioned at the rear end of the rest section 62 are engaged with the bottom wall 7a of the housing 7, and the cooling apparatus 2 and the housing 7 are rotated in a direction for approaching each other taking the engagement section of this fixing hook 64a, 64b and the bottom wall 7a as fulcrum. This rotation engages movable hooks 65a, 65b with the bottom wall 7a, and the housing 7 of the portable computer 1 is coupled with the rest section 62 of the cooling apparatus 2.

Next, the slider 112 is slid form the second position to the first position. There, the cooperation hook 66 rotates from the unlock position to the lock position, and engages with the bottom wall 7a of the housing 7. Thereby, the housing 7 is locked undetectably on the rest section 62.

At the same time, the first to third cogs 111a to 111c meshing with the first to third rack teeth 122a to 122c rotate, and the second heat sink 71 is pushed up from the housing position to the thermal connection position according to the shape of its end cam 115. Thereby, the contact surface 77a of the heat receiving convex sections 77 passes through the through holes 58 and comes into contact with the heat conductive sheet 35. The heat conductive sheet 35 follows the shape of the heat connection surface 34 and the contact surface 77a and comes into a close contact with both of them, and connects thermally the first heat sink 26 with the second heat sink 71.

When the second heat sink 71 is pushed up to the thermal connection position, as shown in FIG. 7, the connection terminals 84 of the second connector 83 come into contact with the connection terminals 37 of the first connector 36 through the connector delivery port 59. At the same time, the operation lever 101 of the switch 100 is pressed by the pressure section 126 of the slider 112, to close the switch 100.

Figure 12:
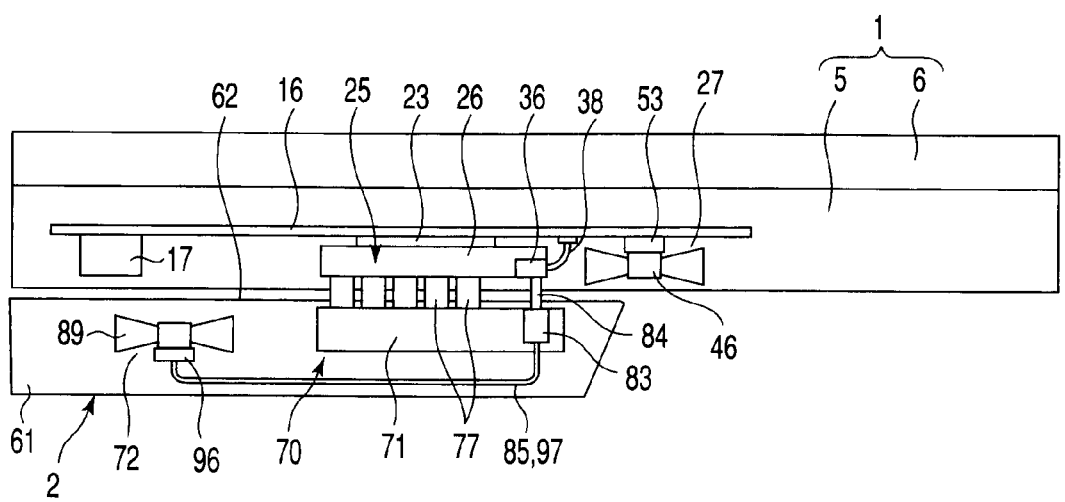
FIG. 12 is a side view of the electronic system schematically showing the state where the portable computer and the cooling apparatus are linked.

Thereby, as shown schematically in FIG. 12, the circuit board 16 of the portable computer 1 and the electric fan 72 of the cooling module 70 are electrically connected. As a result, the power supply, the ground, the rotation control signal for keeping the rotation of the impeller 89 to a fixed value, and the recognition signal for determining the coupling state of the cooling apparatus 2 are transmitted/received between the electric fan 72 and the circuit board 16. The recognition signal is a signal for recognizing that the portable computer 1 is correctly coupled with the rest section 62 of the cooling apparatus 2. When the portable computer 1 recognizes the completion of coupling with the cooling apparatus 2 by transmission/reception of the recognition signal, the flat motor 96 is supplied with power supply voltage, and the electric fan 72 shifts to a standby state.

When the portable computer 1 is coupled with the cooling apparatus 2, if the IC chip 24 of the semiconductor package 23 generates heat, heat from this IC chip 24 is conducted to the heat receiving portion 28 of the first heat sink 26 through the heat dissipation plate 31 and the grease 32. Further, the heat is conducted to the second heat sink 71 of the cooling apparatus 2 from the heat receiving portion 28 through the heat conductive sheet 35, and released therefrom.

When the temperature of the semiconductor package 23 reaches a predetermined value, the electric fan 27 of the cooling unit 25 and the electric fan 72 of the cooling apparatus 2 start to drive according to the signal from the circuit board 16. The electric fan 27 built in the housing 7 delivers air pulled from the first and second suction ports 47, 48 as cooling air to the cooling air passage 40 of the first heat sink 26 and the semiconductor package 23 through the discharge port 49. The cooling air cools down the semiconductor package 23, and cools down the heat exchanging portion 29 of the first heat sink 26 in the course of flowing through the cooling air passage 40. Much of this cooling air is discharged outside the housing 7 from the cooling air outlet 41.

The electric fan 72 built in the cooling apparatus 2 delivers air pulled from the first and second suction ports 90, 91 as cooling air to the cooling air passage 78 of the second heat sink 71. The cooling air cools down the heat exchanging portion 74 in the course of flowing through the cooling air passage 78. This cooling air is discharged outside the apparatus main body 61 from the cooling air discharge port 80 through the cooling air outlet 81.

Therefore, heat from the semiconductor package 23 conducted to the second heat sink 71 is released outside the cooling apparatus 2 borne by the flow of the cooling air. Moreover, as the first heat sink 26 is interposed between the semiconductor package 23 and the second heat sink 71, the heat capacity of the heat radiation path from the semiconductor package 23 to the second heat sink 71 is increased. Therefore, the semiconductor package 23 may be cooled down effectively.

As mentioned above, in a mode of utilization by coupling the portable computer 1 with the cooling apparatus 2, the cooling of the semiconductor package 23 may be maintained by using the first cooling module 70 built in the cooling apparatus 2. As a result, the operation environment temperature of the semiconductor package 23 may be maintained appropriately, by enhancing the cooling performance thereof, and the reliability of the portable computer 1 when operated at full power may be improved.

Next, the procedures for expanding the function of the portable computer 1 using the expansion apparatus 3 shall be described.

When the cooling apparatus 2 is coupled with the portable computer 1, first, the slider 112 (see FIG. 10 and FIG. 11) is slid from the first position to the second position. This sliding rotates the cooperation hook 66 from the lock position to the unlock position, and disengages the same from the bottom wall 7a of the housing 7. Thereby, the second heat sink 71 goes down to the housing position, the thermal connection with the first heat sink 26 is released, and the connection terminals 84 of the second connector 83 disengages from the connection terminals 37 of the first connector 36.

Therefore, the cooling apparatus 2 may be removed from the portable computer 1 by moving the movable hooks 65a, 65b from the lock position to the unlock position.

When the removal of the cooling apparatus 2 is completed, the housing 7 of the portable computer 1 is directed to the rest section 151 of the base 150, and the front wall 7c of the housing 7 is hooked to the guide projections 156a, 156b at the front end of the rest section 151. In this state, the housing 7 is rotated downward taking the engagement section of the front wall 7c and the guide projections 156a, 156b as a fulcrum, and the housing 7 is overlapped on the rest section 151. Thereby, the lock levers 157a, 157b are hooked on the bottom wall 7a of the housing 7, and the portable computer 1 is locked on the rest section 151. At the same time, the shutter 19 opens to expose the first expansion connector 17, and this first expansion connector 17 and the second expansion connector 155 engage with each other.

The engagement of these expansion connectors 17, 155 electrically connect the portable computer 1 and the expansion apparatus 3, as shown schematically in FIG. 19. Therefore, the exchange of control signals between both of them is made possible, and expansion elements of the portable computer 1, such as a DVD drive unit 152, may be supported.

Further, the second expansion connector 155 is electrically connected to the electric fan 163 through the circuit board 153 and the cable 185. The cable 185 has a signal line for rotation control to maintain the rotation of the impeller 177 at a fixed value. The power supply, the ground, and the rotation control signal are transmitted/received between the circuit board 16 of the portable computer 1 and the electric fan 163, and the electric fan 163 shifts to a standby state.

When the housing 7 of the portable computer 1 is locked on the rest section 151, the heat receiving convex sections 166 of the third heat sink 162 comes into contact with the heat conductive sheet 35 through the through holes 58 of the cover 56. The heat receiving convex sections 166 are pressed downward by the contact with the heat conductive sheet 35, and by this pressure, the second cooling module 161 goes down against the energizing force of the compression coil springs 174. Consequently, the heat receiving convex sections 166 are elastically applied to the heat conductive sheet 35 by the compression coil springs 174.

As the result, the heat conductive sheet 35 follows the shape of the heat connection surface 34 or the contact surface 166a and comes into a close contact with both of them, and thermally connects the first heat sink 26 and the third heat sink 162.

When the portable computer 1 is used by coupling with the expansion apparatus 3, if the IC chip 24 of the semiconductor package 23 generates heat, heat from the IC chip 24 is conducted to the heat receiving portion 28 of the first heat sink 26 through the heat dissipation plate 31 and the grease 32. Further, the heat is conducted to the third heat sink 162 of the expansion apparatus 3 from the heat receiving portion 28 through the heat conductive sheet 35, and released therefrom.

When the temperature of the semiconductor package 23 reaches a predetermined value, the electric fan 27 of the cooling unit 25 and the electric fan 163 of the expansion apparatus 3 start to drive respectively according to the signal from the circuit board 16. The electric fan 27 delivers cooling air to the cooling air passage 40 of the first heat sink 26 and the semiconductor package 23, and cools down forcibly both of them. The electric fan 163 of the expansion apparatus 3 delivers air pulled from the first and second suction ports 178, 179 as cooling air to the cooling air passage 167 of the third heat sink 162. The cooling air cools down the third heat sink 162 in the course of flowing through the cooling air passage 167, and is discharged outside the base 150 from the cooling air outlet 168 through the exhaust port 169.

Therefore, heat from the semiconductor package 23 conducted to the third heat sink 162 is released outside the expansion apparatus 3 borne by the flow of the cooling air.

Moreover, as the first heat sink 26 is interposed between the semiconductor package 23 and the third heat sink 162, the heat capacity of the heat radiation path from the semiconductor package 23 to the third heat sink 162 is increased. Therefore, the semiconductor package 23 may be cooled down more effectively.

As mentioned above, in a mode of utilization by coupling the portable computer 1 with the expansion apparatus 3, the cooling of the semiconductor package 23 may be supported by using the second cooling module 161 built in the expansion apparatus 3. As a result, the operational environment temperature of the semiconductor package 23 may be maintained appropriately by enhancing the cooling performance thereof, and the reliability of the portable computer 1 when operated at full power may be improved.

By the way, according to the electronic system of the aforementioned embodiment, in a state where the portable computer 1 is coupled to a cooling apparatus 2 or an expansion apparatus 3, the powering of the cooling module 70 of the cooling apparatus 2, the DVD drive unit 152 of the expansion apparatus 3, or the second cooling module 161 may be controlled by the portable computer 1. Therefore, a single portable computer 1 may support both the cooling apparatus 2 and the expansion apparatus 3, and the cooling apparatus 2 and the expansion apparatus 3 may be used freely depending on the mode of use of the portable computer 1.

In addition, as the electric fan 72 built in the cooling apparatus 2 receives power supply voltage or various control signals from the portable computer 1, the electric fan 72 may be controlled and powered by the portable computer 1. Therefore, it is unnecessary to arrange power supply for powering, or to have circuit components for control of the electric fan 72 in the apparatus main body 61 of the cooling apparatus 2, and this apparatus main body 61 may be formed lighter and smaller than the housing 7 of the portable computer 1.

Therefore, in a case of adhering to the importance particularly to the portability of the portable computer 1, it is possible to carry the portable computer 1 easily, while still maintain a cooling performance sufficient for utilizing the full capacity of the semiconductor package 23 by using the cooling apparatus 2 at the same time.

Further, since both of the electric fan 72 of the cooling apparatus 2 and the electric fan 163 of the expansion apparatus 3 receive a rotation control signal from the portable computer 1, excess revolutions of the electric fans 72, 163 may be controlled. In short, the electric fans 72, 163 tend to increase the revolutions of the impeller 89, 177 even when the driving voltage is kept constant, because, in general, the grease adapts itself to the rotating portions thereof to be lubricated as the operation time elapses. Consequently, if the revolutions of the impellers 89, 177 happen to exceed an appropriate value, it may cause noise.

However, according to the aforementioned embodiment, the revolutions of the impeller 89, 177 may be controlled at an appropriate value, and the operation noise of the electric fans 72, 163 may be reduced.

It should be appreciated that the present invention is not limited to the aforementioned embodiment, but it may be modified without departing from the scope of the subject matter of the present invention.

For instance, though in the aforementioned embodiment, the first and second connectors are built integrally with the first and second heat sinks respectively, these first and second connectors may also be mounted on the bottom wall of the housing and the apparatus main body respectively.

Besides, the second and third heat sinks are not necessarily movable up and down, but they may also be affixed rigidly to the rest section of the cooling apparatus and the expansion apparatus respectively.

Moreover, the electrically driven cooling device is not limited to the electric fan, but it may also be an electric coolant circulation module for circulating, for example, a liquid coolant.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An expansion apparatus detachably capable of being connected to a portable electronic apparatus having a built-in heat generating component and a first expansion connector for function expansion, said expansion apparatus comprising:

a base having an exhaust port and a rest section on which the portable electronic apparatus is placed;

a least one functional component housed in the base to expand function of the portable electronic apparatus;

a cooling module housed in the base, including a heat sink having a cooling air passage and a heat receiving section exposed to the rest section, and an electric fan to supply cooling air to the cooling air passage, the heat receiving section of the heat sink being thermally connected to the heat generating component when the portable electronic apparatus is placed on the rest section; and a second expansion connector placed in the rest section of the base, the second expansion connector being electrically connected to the functional component and the electric fan, and the second expansion connector being connected to the first expansion connector when the portable electronic apparatus is placed in the rest section, whereby the second expansion connector receives power from the first expansion connector to supply the power to the electric fan.

2. The expansion apparatus according to claim 1, wherein when the second expansion connector is connected to the first expansion connector, the electric fan receives a signal from the portable electronic apparatus for controlling the number of rotations.

3. The expansion apparatus according to claim 1, wherein the heat sink is movable between a first position where the heat receiving portion is projected over the rest section and a second position below the first position where the heat receiving portion rests toward the rest section.

4. The expansion apparatus according to claim 3, wherein the heat sink is elastically urged toward the first position via springs.

* * * * *